US008831056B2

(12) United States Patent
Savchenkov et al.

(10) Patent No.: US 8,831,056 B2
(45) Date of Patent: Sep. 9, 2014

(54) COMPACT OPTICAL ATOMIC CLOCKS AND APPLICATIONS BASED ON PARAMETRIC NONLINEAR OPTICAL MIXING IN WHISPERING GALLERY MODE OPTICAL RESONATORS

(75) Inventors: Anatoliy A. Savchenkov, Glendale, CA (US); Lute Maleki, Pasadena, CA (US); Andrey B. Matsko, Pasadena, CA (US); David Seidel, Alta Loma, CA (US)

(73) Assignee: OEwaves, Inc., Pasadena, CA (US)

( * ) Notice: Subject to any disclaimer, the term of this patent is extended or adjusted under 35 U.S.C. 154(b) by 0 days.

(21) Appl. No.: 13/540,518

(22) Filed: Jul. 2, 2012

(65) Prior Publication Data

US 2013/0003766 A1    Jan. 3, 2013

Related U.S. Application Data

(60) Provisional application No. 61/503,584, filed on Jun. 30, 2011.

(51) Int. Cl.
*H01S 3/13* (2006.01)

(52) U.S. Cl.
USPC .......... 372/32; 372/29.02; 372/38.01; 372/18

(58) Field of Classification Search
CPC ..... H01S 3/1303; H01S 3/13; H01S 3/10053; H01S 3/08086; H01S 3/1307; H01S 5/0687; H01S 5/142
USPC ................................ 372/32, 29.02, 38.01, 18
See application file for complete search history.

(56) References Cited

U.S. PATENT DOCUMENTS

| | | | |
|---|---|---|---|
| 5,204,640 | A | 4/1993 | Logan, Jr. |
| 5,220,292 | A | 6/1993 | Bianchini et al. |
| 5,723,856 | A | 3/1998 | Yao et al. |
| 5,751,747 | A | 5/1998 | Lutes et al. |
| 5,777,778 | A | 7/1998 | Yao |
| 5,917,179 | A | 6/1999 | Yao |
| 5,929,430 | A | 7/1999 | Yao et al. |
| 5,985,166 | A | 11/1999 | Unger et al. |
| 6,080,586 | A | 6/2000 | Baldeschwieler et al. |
| 6,178,036 | B1 | 1/2001 | Yao |
| 6,203,660 | B1 | 3/2001 | Unger et al. |
| 6,389,197 | B1 | 5/2002 | Iltchenko et al. |
| 6,417,957 | B1 | 7/2002 | Yao |
| 6,473,218 | B1 | 10/2002 | Maleki et al. |

(Continued)

FOREIGN PATENT DOCUMENTS

| | | |
|---|---|---|
| WO | WO-01/96936 A1 | 12/2001 |
| WO | WO-2005/038513 A2 | 4/2005 |

(Continued)

OTHER PUBLICATIONS

Braginsky, V.B., et al., "Quality-Factor and Nonlinear Properties of Optical Whispering-Gallery Modes," *Physics Letters A*, 137(7, 8):393-397, May 1989.

(Continued)

*Primary Examiner* — Kinam Park
(74) *Attorney, Agent, or Firm* — Perkins Coie LLP

(57) ABSTRACT

Techniques and devices based on optical resonators made of nonlinear optical materials and nonlinear wave mixing to generate optical combs that are stabilized relative to an atomic reference.

28 Claims, 15 Drawing Sheets

(56) References Cited

U.S. PATENT DOCUMENTS

| | | | |
|---|---|---|---|
| 6,476,959 B2 | 11/2002 | Yao | |
| 6,487,233 B2 | 11/2002 | Maleki et al. | |
| 6,488,861 B2 | 12/2002 | Iltchenko et al. | |
| 6,490,039 B2 | 12/2002 | Maleki et al. | |
| 6,535,328 B2 | 3/2003 | Yao | |
| 6,567,436 B1 | 5/2003 | Yao et al. | |
| 6,580,532 B1 | 6/2003 | Yao et al. | |
| 6,594,061 B2 | 7/2003 | Huang et al. | |
| 6,762,869 B2 | 7/2004 | Maleki et al. | |
| 6,795,481 B2 | 9/2004 | Maleki et al. | |
| 6,798,947 B2 | 9/2004 | Iltchenko | |
| 6,853,479 B1 | 2/2005 | Ilchenko et al. | |
| 6,871,025 B2 | 3/2005 | Maleki et al. | |
| 6,873,631 B2 | 3/2005 | Yao et al. | |
| 6,879,752 B1 | 4/2005 | Ilchenko et al. | |
| 6,901,189 B1 | 5/2005 | Savchenkov et al. | |
| 6,906,309 B2 | 6/2005 | Sayyah et al. | |
| 6,922,497 B1 | 7/2005 | Savchenkov et al. | |
| 6,928,091 B1 | 8/2005 | Maleki et al. | |
| 6,943,934 B1 | 9/2005 | Ilchenko et al. | |
| 6,987,914 B2 | 1/2006 | Savchenkov et al. | |
| 7,024,069 B2 | 4/2006 | Savchenkov et al. | |
| 7,043,117 B2 | 5/2006 | Matsko et al. | |
| 7,050,212 B2 | 5/2006 | Matsko et al. | |
| 7,061,335 B2 | 6/2006 | Maleki et al. | |
| 7,062,131 B2 | 6/2006 | Ilchenko | |
| 7,092,591 B2 | 8/2006 | Savchenkov et al. | |
| 7,133,180 B2 | 11/2006 | Ilchenko et al. | |
| 7,173,749 B2 | 2/2007 | Maleki et al. | |
| 7,184,451 B2 | 2/2007 | Ilchenko et al. | |
| 7,187,870 B2 | 3/2007 | Ilchenko et al. | |
| 7,218,662 B1 | 5/2007 | Ilchenko et al. | |
| 7,248,763 B1 | 7/2007 | Kossakovski et al. | |
| 7,260,279 B2 | 8/2007 | Gunn et al. | |
| 7,283,707 B1 | 10/2007 | Maleki et al. | |
| 7,356,214 B2 | 4/2008 | Ilchenko | |
| 7,362,927 B1 | 4/2008 | Ilchenko et al. | |
| 7,369,722 B2 | 5/2008 | Yilmaz et al. | |
| 7,389,053 B1 | 6/2008 | Ilchenko et al. | |
| 7,400,796 B1 | 7/2008 | Kossakovski et al. | |
| 7,440,651 B1 | 10/2008 | Savchenkov et al. | |
| 7,460,746 B2 | 12/2008 | Maleki et al. | |
| 7,480,425 B2 | 1/2009 | Gunn et al. | |
| 7,587,144 B2 | 9/2009 | Ilchenko et al. | |
| 7,630,417 B1 | 12/2009 | Maleki et al. | |
| 7,634,201 B2 | 12/2009 | Maleki et al. | |
| 7,801,189 B2 | 9/2010 | Maleki et al. | |
| 7,813,651 B2 | 10/2010 | Ilchenko et al. | |
| 7,869,472 B2 | 1/2011 | Maleki et al. | |
| 7,929,589 B1 | 4/2011 | Ilchenko et al. | |
| 7,965,745 B2 | 6/2011 | Maleki et al. | |
| 7,991,025 B2 | 8/2011 | Maleki et al. | |
| 8,089,684 B1 | 1/2012 | Koonath et al. | |
| 8,094,359 B1 | 1/2012 | Matsko et al. | |
| 8,102,597 B1 | 1/2012 | Maleki et al. | |
| 8,111,722 B1 * | 2/2012 | Maleki et al. | 372/18 |
| 8,155,913 B2 | 4/2012 | Eliyahu et al. | |
| 8,155,914 B2 | 4/2012 | Eliyahu et al. | |
| 8,159,736 B2 * | 4/2012 | Maleki et al. | 359/239 |
| 2001/0038651 A1 | 11/2001 | Maleki et al. | |
| 2002/0018611 A1 | 2/2002 | Maleki et al. | |
| 2002/0018617 A1 | 2/2002 | Iltchenko et al. | |
| 2002/0021765 A1 * | 2/2002 | Maleki et al. | 375/300 |
| 2002/0081055 A1 | 6/2002 | Painter et al. | |
| 2002/0085266 A1 | 7/2002 | Yao | |
| 2002/0097401 A1 | 7/2002 | Maleki et al. | |
| 2003/0160148 A1 | 8/2003 | Yao et al. | |
| 2004/0100675 A1 | 5/2004 | Matsko et al. | |
| 2004/0109217 A1 | 6/2004 | Maleki et al. | |
| 2004/0218880 A1 | 11/2004 | Matsko et al. | |
| 2004/0240781 A1 | 12/2004 | Savchenkov et al. | |
| 2005/0017816 A1 | 1/2005 | Ilchenko et al. | |
| 2005/0063034 A1 | 3/2005 | Maleki et al. | |
| 2005/0074200 A1 | 4/2005 | Savchenkov et al. | |
| 2005/0123306 A1 * | 6/2005 | Ilchenko et al. | 398/161 |
| 2005/0128566 A1 | 6/2005 | Savchenkov et al. | |
| 2005/0175358 A1 * | 8/2005 | Ilchenko et al. | 398/198 |
| 2005/0185681 A1 * | 8/2005 | Ilchenko et al. | 372/20 |
| 2005/0248823 A1 | 11/2005 | Maleki et al. | |
| 2005/0286602 A1 * | 12/2005 | Gunn et al. | 372/94 |
| 2007/0009205 A1 * | 1/2007 | Maleki et al. | 385/27 |
| 2007/0153289 A1 | 7/2007 | Yilmaz et al. | |
| 2008/0001062 A1 * | 1/2008 | Gunn et al. | 250/206 |
| 2008/0075464 A1 | 3/2008 | Maleki et al. | |
| 2008/0310463 A1 | 12/2008 | Maleki et al. | |
| 2009/0097516 A1 | 4/2009 | Maleki et al. | |
| 2009/0135860 A1 | 5/2009 | Maleki et al. | |
| 2009/0208205 A1 | 8/2009 | Eliyahu et al. | |
| 2009/0251705 A1 | 10/2009 | Le et al. | |
| 2009/0310629 A1 | 12/2009 | Maleki et al. | |
| 2009/0324251 A1 | 12/2009 | Ilchenko et al. | |
| 2011/0110387 A1 | 5/2011 | Maleki et al. | |
| 2011/0150485 A1 | 6/2011 | Seidel et al. | |
| 2011/0255094 A1 | 10/2011 | Mohageg et al. | |
| 2012/0039346 A1 | 2/2012 | Liang et al. | |

FOREIGN PATENT DOCUMENTS

| | | |
|---|---|---|
| WO | WO-2005/055412 A2 | 6/2005 |
| WO | WO-2005/067690 A2 | 7/2005 |
| WO | WO-2005/122346 A2 | 12/2005 |
| WO | WO-2006/076585 A2 | 7/2006 |
| WO | WO-2007/143627 A2 | 12/2007 |

OTHER PUBLICATIONS

Eliyahu, D., et al., "Low Phase Noise and Spurious Levels in Multi-Loop Opto-Electronic Oscillators," *Proceedings of the 2003 IEEE International Frequency Control Sympsoium and PDA Exhibition*, pp. 405-410, May 2003.

Eliyahu, D., et al., "Modulation Response ($S_{21}$) of the Coupled Opto-Electronic Oscillator," *Proceedings of the 2005 IEEE International Frequency Control Symposium and Exposition*, pp. 850-856, Aug. 2005.

Eliyahu, D., et al., "Tunable, Ultra-Low Phase Noise YIG Based Opto-Electronic Oscillator," *IEEE MTT-S International Microwave Symposium Digest*, 3:2185-2187, Jun. 2003.

Gorodetsky, M.L., et al., "Optical Microsphere Resonators: Optimal Coupling to High-$Q$ Whispering-Gallery Modes," *J.Opt. Soc. Am. B*, 16(1):147-154, Jan. 1999.

Gorodetsky, M.L., et al., "Rayleigh Scattering in High-$Q$ Microspheres," *J. Opt. Soc. Am. B*, 17(6):1051-1057, Jun. 2000.

Gorodetsky, M.L., et al., "Ultimate $Q$ of Optical Microsphere Resonators," *Optics Letters*, 21(7):453-455, Apr. 1996.

Hryniewicz, J.V., et al., "Higher Order Filter Response in Coupled Microring Resonators," *IEEE Photonics Technology Letters*, 12(3):320-322, Mar. 2000.

Huang, S., et al., "A 'Turnkey' Optoelectronic Oscillator with Low Acceleration Sensitivity," *2000 IEEE/EIA International Frequency Control Symposium and Exhibition*, pp. 269-279, Jun. 2000.

Ilchenko, V., et al., "Electrooptically Tunable Photonic Microresonators and Photonic Bandgap Waveguide Coupling for Micro-Optoelectronic Oscillators," *GOMACTech 2003*, Tampa, Florida, pp. 1-4.

Ilchenko, V., et al., "High-Q Microsphere Cavity for Laser Stabilization and Optoelectronic Microwave Oscillator," *Proceedings SPIE Microresonators and Whispering-Gallery Modes*, vol. 3611, pp. 190-198, Jan. 1999.

Ilchenko, V., et al., "Microsphere Integration in Active and Passive Photonics Devices," *Proc. of SPIE Laser Resonators III*, vol. 3930, pp. 154-162, Jan. 2000.

Ilchenko, V., et al., "Microtorus: A High-Finesse Microcavity with Whispering-Gallery Modes," *Optics Letters*, 26(5):256-258, Mar. 2001.

Ilchenko, V., et al., "Pigtailing the High-Q Microsphere Cavity: A Simple Fiber Coupler for Optical Whispering-Gallery Modes," *Optics Letters*, 24(11):723-725, Jun. 1999.

Ilchenko, V., et al., "Tunability and Synthetic Lineshapes in High-Q Optical Whispering Gallery Modes," *Proc. of SPIE Laser Resonators and Beam Control VI*, vol. 4969, pp. 195-206, Jan. 2003.

(56) References Cited

OTHER PUBLICATIONS

Ilchenko, V., et al., "Whispering-Gallery-Mode Electro-Optic Modulator and Photonic Microwave Receiver," *J. Opt. Soc. Am. B*, 20(2):333-342, Feb. 2003.

Ito, H., et al., "InP/InGaAs Uni-Travelling-Carrier Photodiode with 310 GHz Bandwidth," *Electronics Letters*, 36(21):1809-1810, Oct. 2000.

Logan, R., et al., "Stabilization of Oscillator Phase Using a Fiber-Optic Delay-Line," *IEEE 45th Annual Symposium on Frequency Control*, pp. 508-512, May 1991.

Maleki, L., "The Opto-Electronic Oscillator: Prospects for Extending the State of the Art in Reference Frequency Generation," *International Topical Meeting on Microwave Photonics*, pp. 195-198, Oct. 1998.

Matsko, A., et al., "Active Mode Locking with Whispering-Gallery Modes," *J. Opt. Soc. Am. B*, 20(11):2292-2296, Nov. 2003.

Matsko, A., et al., "Whispering-Gallery-Mode based Optoelectronic Microwave Oscillator," *Journal of Modern Optics*, 50(15-17):2523-2542, Feb. 2004.

Matsko, A., et al., "Whispering-Gallery-Mode Resonators as Frequency References. I. Fundamental Limitations," *J. Opt. Soc. Am. B*, 24(6):1324-1335, Jun. 2007.

Myers, L.E., et al., "Quasi-Phase-Matched Optical Parametric Oscillators in Bulk Periodically Poled LiNbO3," *J. Opt. Soc. Am. B*, 12(11):2102-2116, Nov. 1995.

Savchenkov, A., et al., "RF photonic signal processing components: From high order tunable filters to high stability tunable oscillators," *IEEE Radar Conference*, pp. 1-6, May 2009.

Savchenkov, A., et al., "Tunable Resonant Single-Sideband Electro-Optical Modulator," *Digest of the IEEE/LEOS Summer Topical Meetings*, pp. 63-64, Jul. 2009.

Savchenkov, A., et al., "Whispering-Gallery-Mode Resonators as Frequency References. II. Stabilization," *J. Opt. Soc. Am. B*, 24(12): 2988-2997, Dec. 2007.

Vassiliev, V.V., et al., "Narrow-Line-Width Diode Laser with a High-$Q$ Microsphere Resonator," *Optics Communications*, 158(1-6):305-312, Dec. 1998.

Yao, X.S., et al., "A Novel Photonic Oscillator," *Digest of the LEOS Summer Topical Meetings*, pp. 17-18, Aug. 1995.

Yao, X.S., et al., "A Novel Photonic Oscillator," *TDA Progress Report 42-122*, pp. 32-43, Aug. 1995.

Yao, X.S., et al., "Converting Light into Spectrally Pure Microwave Oscillation," *Optics Letters*, 21(7):483-485, Apr. 1996.

Yao, X.S., et al., "Coupled Optoelectronic Oscillators for Generating Both RF Signal and Optical Pulses," *Journal of Lightwave Tecnhology*, 18(1):73-78, Jan. 2000.

Yao, X.S., et al., "Dual Microwave and Optical Oscillator," *Optics Letters*, 22(24):1867-1869, Dec. 1997.

Yao, X.S., et al., "Multiloop Optoelectronic Oscillator," *IEEE Journal of Quantum Electronics*, 36(1):79-84, Jan. 2000.

Yao, X.S., et al., "Optoelectronic Microwave Oscillator," *J. Opt. Soc. Am. B*, 13(8):1725-1735, Aug. 1996.

Yao, X.S., et al., "Optoelectronic Oscillator for Photonic Systems," *IEEE Journal of Quantum Electronics*, 32(7):1141-1149, Jul. 1996.

Yu, J., et al., "Compact Optoelectronic Oscillator with Ultra-Low Phase Noise Performance," *Electronics Letters*, 35(18):1554-1555, Sep. 1999.

\* cited by examiner

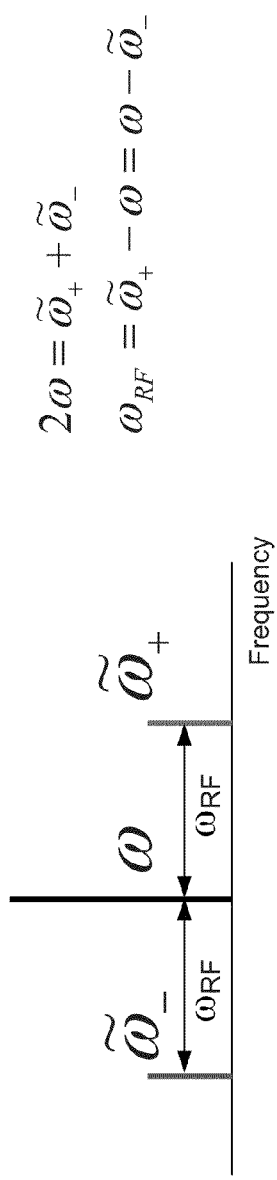
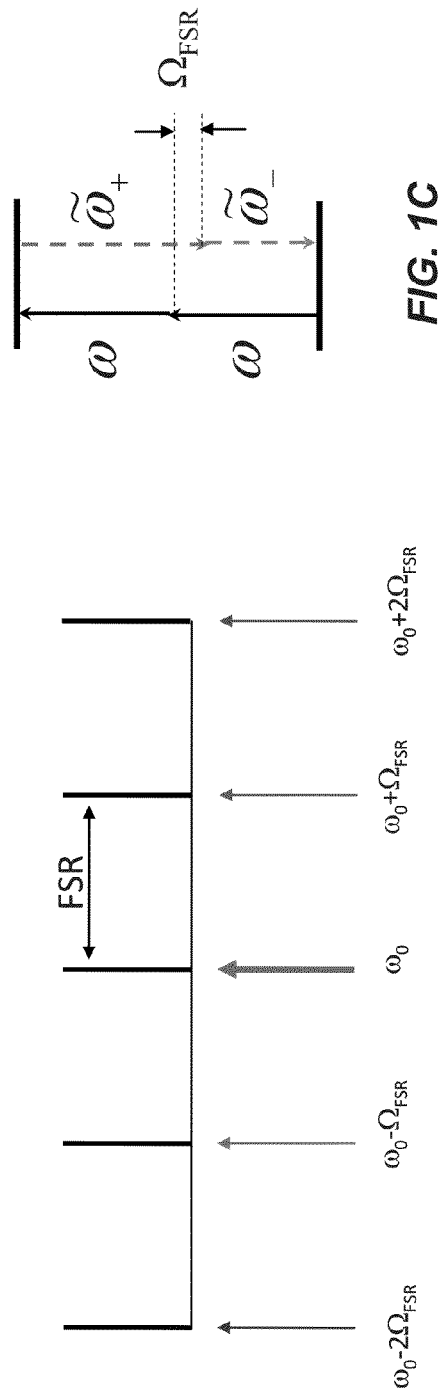

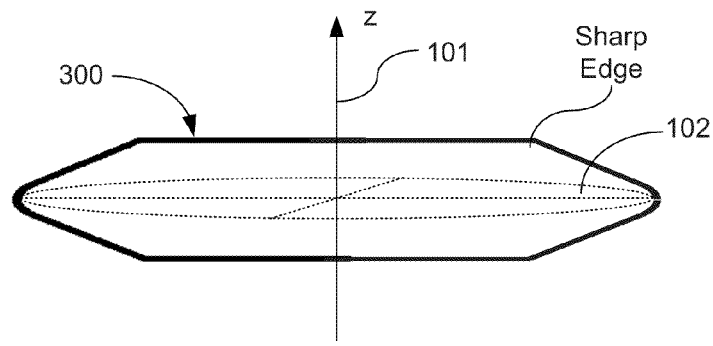
FIG. 3
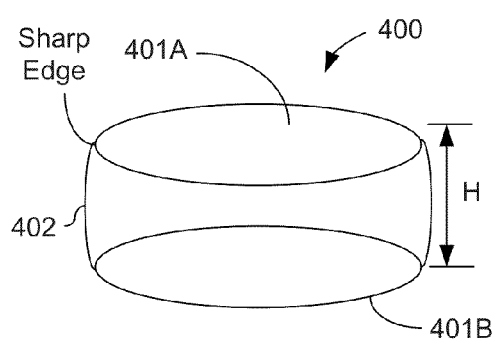
FIG. 4A
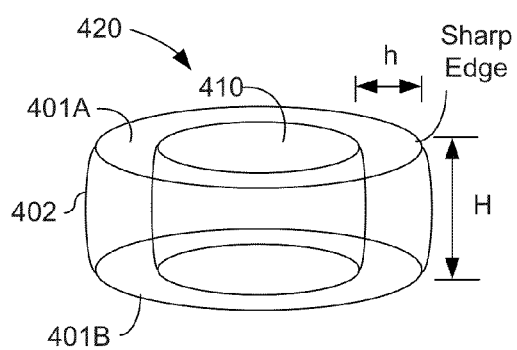
FIG. 4B
FIG. 5A
FIG. 5B

COMPACT OPTICAL ATOMIC CLOCKS AND APPLICATIONS BASED ON PARAMETRIC NONLINEAR OPTICAL MIXING IN WHISPERING GALLERY MODE OPTICAL RESONATORS

PRIORITY CLAIM AND CROSS-REFERENCE TO RELATED APPLICATION

This patent document claims the priority of U.S. Provisional Application No. 61/503,584 entitled "Compact Optical Atomic Clocks and Applications Using Whispering Gallery Mode Resonators" and filed on Jun. 30, 2011. The entire disclosure of the above patent application is incorporated by reference as part of the disclosure of this document.

BACKGROUND

This patent document relates to devices and techniques for generating stabilized oscillation signals and clock signals, including photonic, RF and microwave devices having optical whispering gallery mode resonators.

Precision oscillation and clock signals are widely used in various applications. Atomic transitions such as alkali hyperfine transitions in cesium or rubidium can be used as atomic clocks to generate clock references. RF or microwave oscillators or devices can be stabilized in frequency to atomic clocks.

SUMMARY

This document provides techniques and devices that use optical resonators made of nonlinear optical materials to provide nonlinear wave mixing and atomic references for generating stabilized RF or microwave signals.

In one aspect, a device is provided to include an optical resonator formed of an optical material exhibiting optical nonlinearity and producing an optical frequency comb based on nonlinear wave mixing caused by the optical nonlinearity; a laser that is tunable and produces laser light that interacts with the optical material of the optical resonator based on the nonlinear wave mixing to produce the optical frequency comb; a laser locking mechanism that locks the laser to the optical resonator; an atomic reference device that includes atoms or molecules providing an atomic or molecular transition and is coupled to receive light coupled out of the optical resonator to produce output light carrying information of the atomic or molecular transition; a first optical detector that receives the output light from the atomic reference device to produce a first detector output; a feedback circuit that receives the first detector output and produces a feedback signal, the feedback circuit coupled to at least one of the laser or the optical resonator to apply the feedback signal to stabilize the at least one of the laser or the optical resonator; and a second optical detector that receives light coupled by the optical coupler out of the optical resonator to convert the optical frequency comb into a second detector signal which is stabilized in frequency relative to the atomic or molecular transition of the atomic reference device.

In another aspect, a device is provided to include an optical resonator which exhibits optical nonlinearity and is configured to be a whispering gallery mode resonator supporting optical whispering gallery modes; a laser that is tunable and produces laser light; an optical coupler that couples the laser light into the optical resonator to cause generation of an optical comb signal of different frequencies based on nonlinear wave mixing in the optical resonator; an atomic reference device that includes atoms or molecules providing an atomic or molecular transition as a frequency reference; and a locking circuit that locks at least one of the optical resonator or the laser in frequency relative to the atomic or molecular transition of the atomic reference device to stabilize the optical comb of different frequencies.

In another aspect, a method is provided for generating a radio frequency (RF) or microwave signal stabilized relative to an atomic frequency reference. This method includes directing laser light into an optical resonator to produce confined laser light inside the optical resonator in at least two different optical resonator modes that are separated by a free spectral range (FSR) of the optical resonator or a harmonic of the FSR; coupling the confined laser light inside the optical resonator out to as an optical resonator output having two optical spectral components corresponding to the at least two different optical resonator modes; locking the optical resonator relative to an atomic frequency reference to stabilize the two optical spectral components corresponding to the at least two different optical resonator modes in the optical resonator output; and directing the optical resonator output into a photodetector to produce a detector signal at a frequency of a frequency difference between the two optical spectral components that is stabilized relative to the atomic frequency reference.

In another aspect, a method is provided for generating and stabilizing an optical comb relative to an atomic frequency reference. This method includes operating a laser to produce laser light; directing the laser light into an optical resonator exhibiting optical nonlinearity and supporting optical whispering gallery modes with sufficient power to generate an optical comb signal of different frequencies based on nonlinear wave mixing in the optical resonator; locking the laser and the optical resonator relative to each other; and locking the laser or the optical resonator relative to an atomic frequency reference to stabilize the optical comb of different frequencies.

In yet another aspect, a device is provided to include an optical resonator formed of a crystalline material exhibits optical nonlinearities and configured to be a whispering gallery mode resonator supporting optical whispering gallery modes; a laser that is tunable and produces laser light; an optical coupler that couples the laser light into the optical resonator which produces an optical comb of different frequencies based on optical nonlinearities of the crystalline material and couples light inside the optical resonator out of the optical resonator back to the laser to cause injection locking of the laser to the optical resonator; an atomic reference device that includes atoms or molecules providing a atomic or molecular transition and is coupled to receive light coupled out of the optical resonator to produce output light carrying information of the a atomic or molecular transition; a first optical detector that receives the output light from the atomic reference device to produce a first detector output; a feedback circuit that receives the first detector output and produces a feedback signal, the feedback circuit coupled to at least one of the laser or the optical resonator to apply the feedback signal to stabilize the at least one of the laser or the optical resonator; and a second optical detector that receives light coupled by the optical coupler out of the optical resonator to convert the optical comb of different frequencies into a second detector signal which is stabilized in frequency relative to the atomic or molecular transition of the atomic reference device.

These and other aspects and implementations are described in detail in the drawings, the description and the claims.

BRIEF DESCRIPTION OF THE DRAWINGS

FIGS. 1A, 1B, 1C and 1D show one example of an optical comb generation device that is stabilized to an atomic reference.

FIGS. 2A, 2B, 3, 4A, 4B, 5A and 5B show examples of WGM resonators and optical coupling designs.

DETAILED DESCRIPTION

Figure 1A:
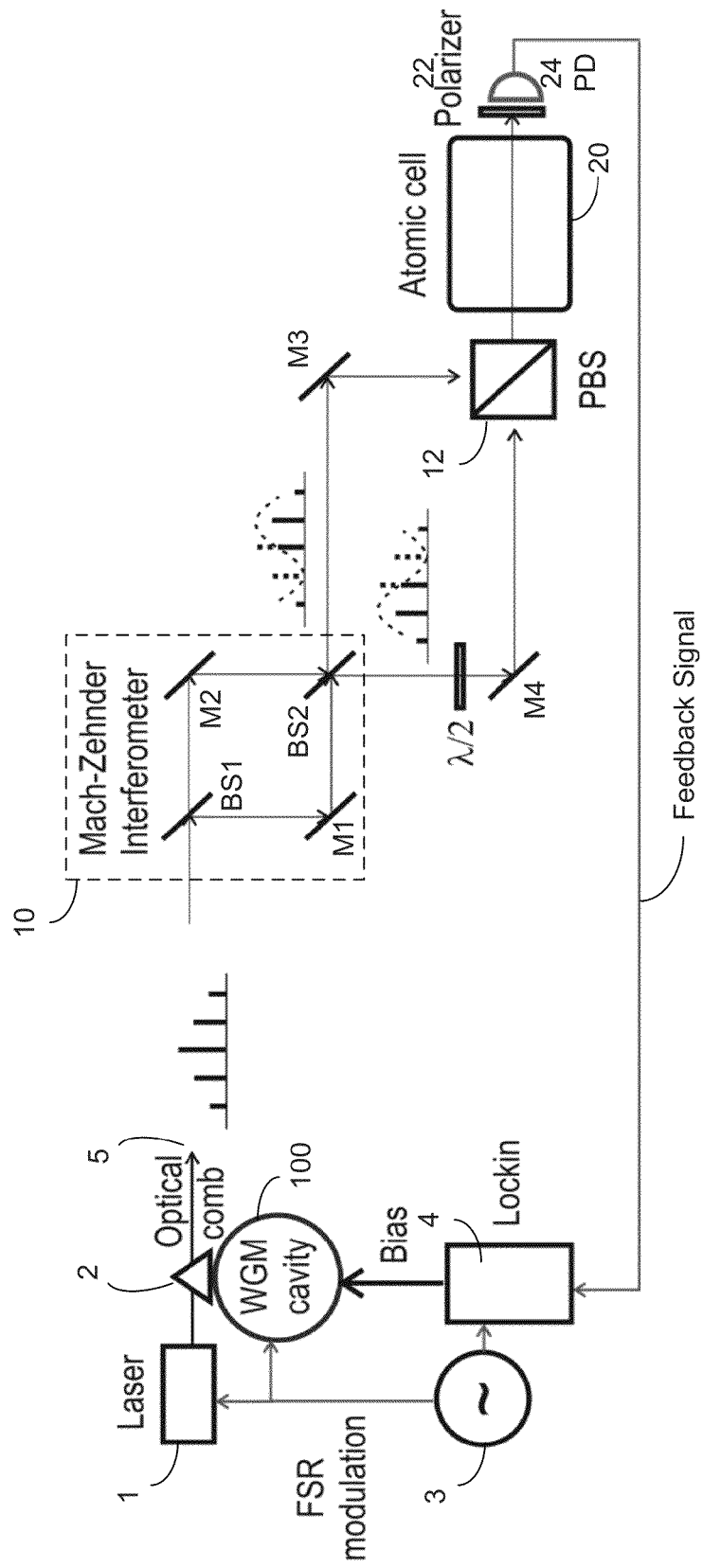

An optical comb is an optical signal of periodic frequency or spectral components or optical harmonics and can be characterized by optical frequencies of the individual frequency components or a combination of an optical frequency of at least one of the frequency components and the frequency spacing or repetition frequency of the frequency components. The devices and techniques described in this document include devices and techniques that stabilize, based on or with respect to, an atomic frequency reference or clock signal, the repetition frequency of the optical combs generated based on four wave mixing and/or hyperparametric oscillations in nonlinear optical resonators, such as crystalline whispering gallery mode resonators, under proper optical pumping by laser light from a laser. The implementation examples described in this document can use a single atomic frequency reference for, stabilizing an optical comb or two different atomic frequency references for providing two different frequency locking or stabilizing points to effectuate more robust stabilization of an optical comb signal. Such stabilized optical comb signals are representative of the relevant atomic frequency references or clocks and, for various practical applications, may be treated as atomic clocks. Such a stabilized optical comb signal can be detected by a photodetector which converts the optical comb signal into an RF or microwave signal. Depending on the bandwidth of the photodetector and the corresponding circuitry, the RF or microwave signal can include an RF or microwave frequency corresponding to the frequency spacing between adjacent frequency components and/or other frequency harmonics of this frequency spacing. The photodetector and its corresponding circuitry can be configured to select one or more RF or microwave frequencies in the RF or microwave signal.

The devices and techniques described in this document use optical processing to take the advantage of the high precision of optical atomic or molecular transitions in atoms or molecules (i.e., atomic clocks)) in the optical domain and to stabilize an optical signal, such as an optical comb, with respect to the atomic clocks. The stabilized optical signal is then converted by a photodetector into the RF or microwave domain to obtain an RF or microwave signal with the frequency precision or stability of the atomic clock. This scheme of optical stabilization and conversion from the optical domain to the RF or microwave domain may be implemented by generating an optical signal with at least two different optical spectral components with a frequency separation corresponding to a desired RF or microwave frequency without using an optical comb signal. Without needing the optical comb signal, the nonlinear optical resonator may be replaced by an optical resonator that does not exhibit optical nonlinearity. One example provided in this document is to lock two different lasers at two laser carrier frequencies to an atomic frequency reference where the frequency difference of the two laser carrier frequencies is set at the desired RF or microwave frequency.

The following sections describe implementations based on nonlinear optical wave mixing in nonlinear optical resonators for generating optical combs. The nonlinear optical resonators can be in various optical resonator configurations. Nonlinear whispering gallery mode resonators can be particular beneficial in part because such resonators can be fabricated with high Q values to provide efficient nonlinear wave mixing at low power levels and can be packaged in compact forms or integrated on RF chips. Nonlinear optical resonators in other resonator configurations, such as Fabry-Perot resonators, can also be used to implement the devices and techniques described in this document.

In some implementations, properly selected optical harmonics ("optical comb") are generated in the optical crystalline whispering gallery mode resonator and are injected into an atomic reference, e.g., an atomic vapor cell, an atomic trap, or an atomic beam, to produce an output optical signal that carries information of the atomic reference frequency. This output optical signal is used to generate a feedback signal for stabilizing either one or both of the laser and the optical crystalline whispering gallery mode resonator. For example, under proper polarization preparation of the harmonics, optical detection of light from the atomic reference is performed at a photodiode, and a feedback is generated from the processed RF signal from the output of the photodiode and is fed to the laser that is used to optically pump the resonator, or the resonator itself. This feedback is used to effectuate stabilization of the optical comb which can be demodulated on a fast photodiode to produce RF or microwave signals of frequency stability that is locked to the atomic reference. Therefore, this whispering gallery mode (WGM) resonator-based hyperparametric oscillator with an atomic reference can transfer the stability of an atomic transition to the RF beat of optical lines on the fast photodiode.

This combination of using a nonlinear WGM resonator to generate an optical comb and locking the generated optical comb to the atomic reference can be used to provide compact, low cost and highly adaptable RF or microwave oscillators with atomic reference precision. For example, such devices can be used as atomic clocks based on optical transitions in the atomic reference used and can be configured in compact sizes and operated under low power.

The atomic reference can be implemented in various configurations based on atomic or molecular transitions. For example, U.S. Pat. No. 6,762,869 entitled "Atomic clock based on an opto-electronic oscillator" describes examples of opto-electronic oscillators having a frequency locking mechanism to stabilize the oscillation frequency of the oscillators to an atomic frequency reference such as an atomic vapor cell. For another example, U.S. Pat. No. 8,159,736 entitled "Tunable single sideband modulators based on electro-optic optical whispering gallery mode resonators and their applications" describes examples of opto-electronic oscillators based on tunable single sideband (SSB) modulation in whispering gallery mode resonators formed of electro-optic materials while using an atomic vapor cell in the optical portion of an opto-electronic loop to stabilize the RF or microwave oscillation. The disclosures of the above mentioned U.S. patents are incorporated by reference as part of the disclosure of this document.

The atoms in an atomic cell, e.g., an alkali vapor such as rubidium or cesium, may be used to provide a stable atomic frequency reference for stabilizing devices described in this document. Such a stable atomic frequency reference can be generated in various ways. For example, the absorption peak at a particular optical atomic transition can be directly used as such a stable atomic reference where the optical transmission (or, alternatively, absorption) of an atomic vapor cell at such a transition can be measured to indicate a shift in frequency of the laser or the optical resonator resonance or a frequency in a signal. For another example, an atomic transition associated with three energy levels based on a quantum interference effect known as electromagnetically induced transparency may also be used as such a stable atomic frequency reference. In rubidium or cesium, two ground state hyperfine levels and a common excited state can be used to provide the atomic reference where the difference in frequency between the two ground state hyperfine levels corresponds to a desired RF or microwave frequency. Examples for such atoms include cesium with a gap of about 9.2 GHz between two hyperfine ground states and rubidium with a gap of about 6.8 GHz between two hyperfine ground states. In general, the two ground states are isolated from each other in absence of optical pumping via the common excited state. If only one optical field is present and is in resonance with either of the two optical transitions, all electrons will be eventually transferred from one ground state associated in the atomic transition in resonance with the one optical field to the other ground state that is not in resonance with the one optical field. This will turn the atomic cell to be transparent to the one optical field. If a second optical field is simultaneously applied to the other atomic transition and is coherent with the first optical field, the two ground states are no longer isolated from each other. When the two applied optical fields are exactly in resonance with the two atomic transitions, a quantum-mechanical coherent population trapping occurs in which the two ground states are quantum-mechanically interfered with each other to form an out-of-phase superposition state and become decoupled from the common excited state. Under this condition, there are no permissible dipole moments between the superposition state and the excited state and hence no electron in either of the two ground states can be optically excited to the excited state. As a result, the atomic cell becomes transparent to both optical fields that are respectively in resonance with the two atomic transitions sharing the common excited state. When either of the two applied optical fields is tuned away from its corresponding resonance, the atoms in the ground states become optically absorbing again. This electromagnetically induced transparency leads a narrow transmission spectral peak with respect to the frequency detuning of either of the two simultaneously-applied optical fields. This signal can be used as a feedback for stabilizing the WGM resonator or the laser or both.

FIGS. 1A, 1B, 1C and 1D show the structure and operation of an exemplary optical comb generation device that is stabilized to an atomic reference based on a nonlinear optical WGM resonator. This device includes a tunable laser 1, e.g., a diode laser or semiconductor laser that produces laser light that is coupled into the nonlinear optical WGM resonator 100 via an optical coupler 2, which, can be, e.g., a prism coupler for optical evanescent coupling. The nonlinear optical WGM resonator 100 is formed of a crystalline material that exhibits optical nonlinearities and the resonator 100 is configured to support optical whispering gallery modes. The laser 1 is operated to generate sufficient laser power of the laser light that is coupled inside the resonator 100 to be above the threshold for the nonlinear optical wave mixing that produces an optical comb of different frequencies.

In FIG. 1A, the laser 1 and the resonator 100 are locked in frequency with respect to each other based on a suitable locking mechanism. For example, an injection locking can be implemented by using the optical coupler 2 to couple light in the resonator 2 that counter-propagates the laser light that is initially coupled into the resonator 100 to generate a feedback laser beam to the laser 1 to cause injection locking between the laser 1 to the optical resonator 100. As another example, a Pound-Drever-Hall (PDH) laser feedback locking scheme can be used to lock the laser 1 and the optical resonator 100 to each other.

Also shown in FIG. 1A, an atomic cell 20 is provided as the atomic reference and is coupled to receive light coupled out of the optical resonator 100 to produce output light carrying information of the atomic reference. An optical detector 24 (e.g., a photodiode) is placed to receive the output light from the atomic cell 20 (e.g., optical transmission) to produce a detector output as the feedback signal. A feedback circuit 4 receives the detector output and produces a feedback signal and the feedback circuit 4 is coupled to at least one of the laser 1 or the optical resonator 100 to apply the feedback signal to stabilize the at least one of the laser 1 or the optical resonator 100.

In the example illustrated in FIG. 1A, the feedback circuit 4 includes a lock-in amplifier as part of the circuit to generate a bias control signal for controlling the resonator 100 to be stabilized with respect to the atomic reference in the atomic cell 20. This bias control signal causes the resonance of the optical resonator 100 to shift to reduce or minimize an undesired drift in frequency from a particular atomic frequency reference. In this regard, the optical resonator 100 is tunable in frequency and this tuning of the resonator 100 can be implemented in various configurations in response to the bias control. For example, the temperature of the resonator 100 can be used to tune the resonator resonance; the resonator 100 may be squeezed by an actuator such as a mechanical actuator like a squeezer or a piezo-electric actuator to change its dimension to tune the resonator resonance; or the resonator 100 can be made of an electro-optical material so that an external voltage can be applied to tune the resonator resonance by changing the refractive index via the electro-optical effect.

The detector output or of the photodetector 24 as the feedback signal is an error signal that indicates the drift of the resonance of the optical resonator 100 from the particular atomic frequency reference. This can be generated by dithering the resonance of the optical resonator 100 via a relatively slow dithering modulation. This dithering modulation in the resonance of the optical resonator 100 causes a change in the detector signal produced by the photodetector 24 to indicate the amount and direction of the draft in the resonance of the optical resonator from the particular atomic frequency reference. An oscillation source 3 is provided to generate an oscillation signal at a relatively slow dither frequency labeled as "FSR modulation" that is applied to both the laser 1 and the resonator 100 to cause a dither modulation of the laser carrier at the laser carrier frequency $\omega$. The free spectral range (FSR) of the optical resonator 100 is set equal to the frequency difference, $\omega_{RF}$ (RF or microwave frequency), between the two ground states of two atomic transitions sharing the common excited state as described above. The laser light inside the resonator 100 undergoes the nonlinear parametric wave mixing inside the nonlinear material of the resonator 100 to cause parametric amplification by taking energy from the laser light at the optical carrier frequency $\omega$ to generate light at one or more new optical frequencies corresponding to the resonator resonances or the harmonics of the resonator resonances. The result of this nonlinear wave mixing and parametric amplification is the optical comb generated inside the resonator 100.

FIGS. 1B, 1C and 1D show the frequencies in involved in the nonlinear wave mixing and parametric amplification. FIG. 1D shows frequency components in the parametric amplification. FIGS. 1B and 1C show the frequencies in the frequency domain and in the energy level, respectively. FIG. 1D shows the spectrum of the optical resonator 100 when the laser carrier is tuned to be resonant at a resonator resonance $\omega_0$ and represents the frequency components in the optical comb generated inside the resonator 100.

The light coupled out of the resonator 100 is shown as an optical comb output 5 in FIG. 1A. A fast photodetector can be placed in the optical path of the optical comb output 5 to convert the optical comb output 5 into an RF output, which is also stabilized in frequency relative to the atomic reference provided by the atomic cell 20.

The optical comb output 5 is directed to a Mach-Zehnder interferometer 10 in FIG. 1A that includes a beam splitter BS1 that splits the received light into a first beam along a first optical path with a first mirror M1 and a second beam along a second optical path with a second mirror M2. A second beam splitter BS2 is used to combine the two beams to cause the two beams to spatially overlap and optically interfere to produce a first output beam to a third mirror M3 and a second output beam to a fourth mirror M4. The two output beams at the BS2 of the interferometer 10 are two optical signals at two different optical frequencies that are respectively in resonance with the two different optical transitions associated with two ground states sharing the same common excited state as discussed above. A polarization rotator, such as a half waveplate, can be placed in one of the two beams to cause the polarization of one beam to be rotated by 90 degrees so the two beams are orthogonally polarized. The two orthogonally polarized beams are then combined and overlapped with each other at a polarization beam splitter (PBS) into a combined beam that enters the atomic cell 20. The two orthogonally polarized beams in the atomic cell 20 are in resonance with two atomic transitions sharing the common excited state as describe above for the electromagnetically induced transparency: one beam is in resonance with one transition and the other beam is in resonance with another transition. The optical transmission of the atomic cell 20 is directed through an optical polarizer 22 and then to the optical detector 24. The linear polarizer 22 is oriented at 45 degrees with respect to either polarization of the two orthogonally polarized beams to allow both beams to reach the optical detector 24.

In FIG. 1A, the four-wave mixing and hyperparametric oscillations in the crystalline whispering gallery mode resonator 100 generate tunable optical comb 5. The frequency stability of the comb 5 is given by the frequency stability of the resonator modes of the resonator 100. As the result, the frequency separation between comb modes drifts with time due to various factors such as thermal processes in the resonator 100. To realize stable frequency difference between the comb harmonics, the comb can be locked to a reference possessing absolute frequency stability, e.g. the frequency reference from the atomic cell 20.

The resonator 100 can be fabricated with a structure with a free spectral range (FSR) such that m*FSR=$\omega_{RF}$, where RF frequency $\omega_{RF}$ is the RF frequency of the ground state hyperfine transition of the atoms or molecules, such as alkaline or other type of atoms/ions, and m is an integer number. Hence, the RF frequency $\omega_{RF}$ can be equal to or be a harmonic of the FSR of the resonator 100. The ground state of the atoms/ions should possess a clock transition and should demonstrate the phenomenon of the electromagnetically induced transparency while interrogated with a dichromatic light. The resonator 100 is pumped with the laser light from the laser 1 and should be resonant with one of the resonator modes and the optical atomic transition of interest in the atomic cell 20. The power of the laser CW light should be powerful enough to cross the threshold of the optical hyperparametric oscillations in the resonator 100. The laser 1 should be locked to a proper resonator mode via injection locking, PDH locking, or other locking technique.

As shown in FIG. 1A, the generated optical comb output 5 can be processed using one or several Mach-Zehnder interferometers to separate comb frequency components so that two optical components resonant with two optical hyperfine transitions of the atoms/ions follow different optical paths. The polarizations of the spatially separated comb harmonics should be changed to linear orthogonal or circular counter-rotating. After that the beams should be directed into the atomic cell 20.

In operation of the device in FIG. 1A, the error signal for locking the optical comb to the atomic reference in the atomic cell 20 is generated by the measurement of the relative phase shift acquired by the oppositely polarized optical harmonics during their interaction with the atomic sample in the atomic cell 20. The characteristic spectral width of the error signal is equal to the spectral width of the electromagnetically induced transparency resonance.

In the device in FIG. 1A and other devices described in this document, the nonlinear process of four wave mixing (FWM) in the crystalline whispering gallery mode resonator 100 exhibits a cubic nonlinearity, e.g., calcium fluoride or other nonlinear materials. Referring to FIG. 1D, in the FWM, the large field intensity in the high finesse or high Q WGM resonator 100 transforms two pump photons at the laser carrier frequency $\omega$ into two sideband photons at $\omega_+$ and $\omega_-$, i.e., a signal photon and an idler photon. The sum of frequencies of the generated photons at $\omega_+$ and $\omega_-$, is equal to twice the frequency of the pumping light at the laser carrier frequency $\omega$ because of the energy conservation law.

The optical resonators are optical whispering-gallery-mode ("WGM") resonators which support a special set of resonator modes known as whispering gallery ("WG") modes. These WG modes represent optical fields confined in an interior region close to the surface of the resonator due to the total internal reflection at the boundary. For example, a dielectric sphere may be used to form a WGM resonator where WGM modes represent optical fields confined in an interior region close to the surface of the sphere around its equator due to the total internal reflection at the sphere boundary. Quartz microspheres with diameters on the order of $10$~$10^2$ microns have been used to form compact optical resonators with Q values greater than $10^9$. Such hi-Q WGM resonators may be used to produce oscillation signals with high spectral purity and low noise. Optical energy, once coupled into a whispering gallery mode, can circulate at or near the sphere equator over a long photon life time.

WGM resonators made of crystals can be optically superior to WGM resonators made of fused silica. WGM resonators made of crystalline $CaF_2$ can produce a Q factor at or greater than $10^{10}$. Such a high Q value allows for various applications, including generation of kilohertz optical resonances and low-hreshold optical hyperparametric oscillations due to the Kerr nonlinear effect. The following sections first describe the exemplary geometries for crystal WGM resonators and then describe the properties of WGM resonators made of different materials. In some of the examples described below, in addition to the nonlinear optical property of the material for the WGM resonators, the material may also exhibit an electro-optical effect in response to an externally applied control signal, e.g., an RF signal, to provide a tuning mechanism for adjusting the resonator resonance.

Figure 2A:
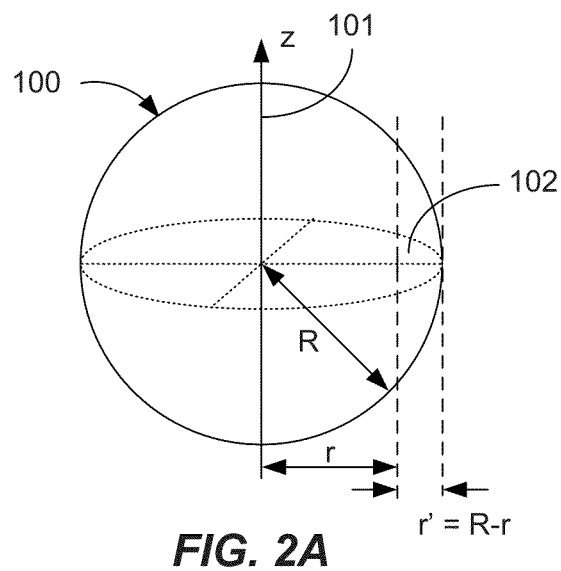
Figure 2B:
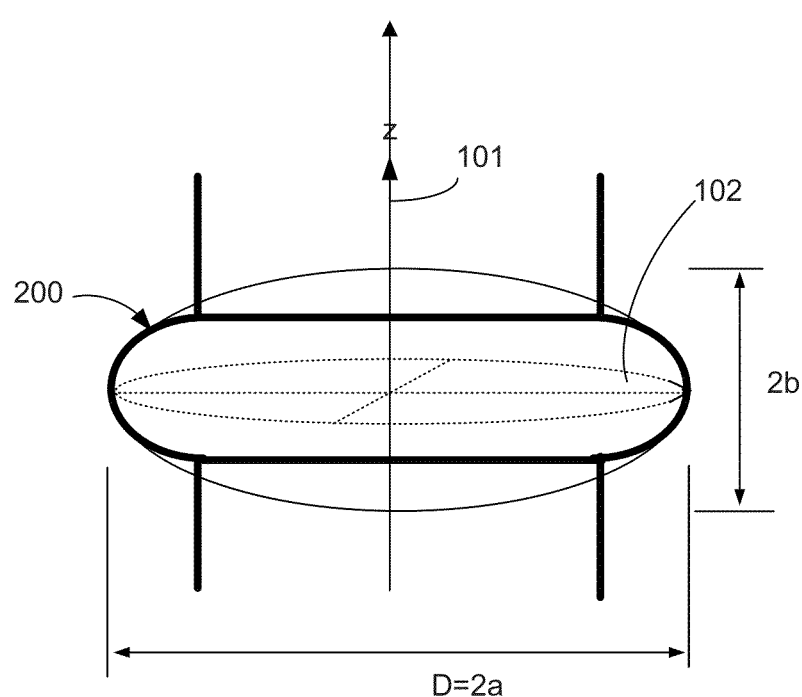

FIGS. 2A, 2B, and 3 illustrate three exemplary WGM resonators. FIG. 2A shows a spherical WGM resonator 100 which is a solid dielectric sphere. The sphere 100 has an equator in the plane 102 which is symmetric around the z axis 101. The circumference of the plane 102 is a circle and the plane 102 is a circular cross section. A WG mode exists around the equator within the spherical exterior surface and circulates within the resonator 100. The spherical curvature of the exterior surface around the equator plane 102 provides spatial confinement along both the z direction and its perpendicular direction to support the WG modes. The eccentricity of the sphere 100 generally is low.

FIG. 2B shows an exemplary spheroidal microresonator 200. This resonator 200 may be formed by revolving an ellipse (with axial lengths a and b) around the symmetric axis along the short elliptical axis 101 (z). Therefore, similar to the spherical resonator in FIG. 2A, the plane 102 in FIG. 2B also has a circular circumference and is a circular cross section. Different from the design in FIG. 2A, the plane 102 in FIG. 2B is a circular cross section of the non-spherical spheroid and around the short ellipsoid axis of the spheroid. The eccentricity of resonator 100 is $(1-b^2/a^2)^{1/2}$ and is generally high, e.g., greater than $10^{-1}$. Hence, the exterior surface is the resonator 200 is not part of a sphere and provides more spatial confinement on the modes along the z direction than a spherical exterior. More specifically, the geometry of the cavity in the plane in which Z lies such as the zy or zx plane is elliptical. The equator plane 102 at the center of the resonator 200 is perpendicular to the axis 101 (z) and the WG modes circulate near the circumference of the plane 102 within the resonator 200.

FIG. 3 shows another exemplary WGM resonator 300 which has a non-spherical exterior where the exterior profile is a general conic shape which can be mathematically represented by a quadratic equation of the Cartesian coordinates. Similar to the geometries in FIGS. 1 and 2, the exterior surface provides curvatures in both the direction in the plane 102 and the direction of z perpendicular to the plane 102 to confine and support the WG modes. Such a non-spherical, non-elliptical surface may be, among others, a parabola or hyperbola. Note that the plane 102 in FIG. 3 is a circular cross section and a WG mode circulates around the circle in the equator.

The above three exemplary geometries in FIGS. 2A, 2B, and 3 share a common geometrical feature that they are all axially or cylindrically symmetric around the axis 101 (z) around which the WG modes circulate in the plane 102. The curved exterior surface is smooth around the plane 102 and provides two-dimensional confinement around the plane 102 to support the WG modes.

Notably, the spatial extent of the WG modes in each resonator along the z direction 101 is limited above and below the plane 102 and hence it may not be necessary to have the entirety of the sphere 100, the spheroid 200, or the conical shape 300. Instead, only a portion of the entire shape around the plane 102 that is sufficiently large to support the whispering gallery modes may be used to form the WGM resonator. For example, rings, disks and other geometries formed from a proper section of a sphere may be used as a spherical WGM resonator.

FIGS. 4A and 4B show a disk-shaped WGM resonator 400 and a ring-shaped WGM resonator 420, respectively. In FIG. 4A, the solid disk 400 has a top surface 401A above the center plane 102 and a bottom surface 401B below the plane 102 with a distance H. The value of the distance H is sufficiently large to support the WG modes. Beyond this sufficient distance above the center plane 102, the resonator may have sharp edges as illustrated in FIGS. 3, 4A, and 4B. The exterior curved surface 402 can be selected from any of the shapes shown in FIGS. 1, 2, and 3 to achieve desired WG modes and spectral properties. The ring resonator 420 in FIG. 4B may be formed by removing a center portion 410 from the solid disk 400 in FIG. 4A. Since the WG modes are present near the exterior part of the ring 420 near the exterior surface 402, the thickness h of the ring may be set to be sufficiently large to support the WG modes.

An optical coupler is generally used to couple optical energy into or out of the WGM resonator by evanescent coupling. FIGS. 5A and 5B show two exemplary optical couplers engaged to a WGM resonator. The optical coupler may be in direct contact with or separated by a gap from the exterior surface of the resonator to effectuate the desired critical coupling. FIG. 5A shows an angle-polished fiber tip as a coupler for the WGM resonator. A waveguide with an angled end facet, such as a planar waveguide or other waveguide, may also be used as the coupler. FIG. 5B shows a micro prism as a coupler for the WGM resonator. Other evanescent couplers may also be used, such as a coupler formed from a photonic bandgap material.

WGM resonators can be used to provide an effective way to confine photons in small volumes for long periods of time. As such, WGM resonators have a wide range of applications in both fundamental studies and practical devices. For example, WGM resonators can be used for storage of light with linear optics, as an alternative to atomic light storage, as well as in tunable optical delay lines, a substitute for atomic-based slow light experiments. WGM resonators can also be used for optical filtering and opto-electronic oscillators, among other applications.

Crystalline WGM resonators with kilohertz-range resonance bandwidths at the room temperature and high resonance contrast (50% and more) are promising for integration into high performance optical networks. Because of small modal volumes and extremely narrow single-photon resonances, a variety of low-threshold nonlinear effects can be observed in WGM resonators based on small broadband nonlinear susceptibilities. As an example, below we report the observation of thermo-optical instability in crystalline resonators, reported earlier for much smaller volume high-Q silica microspheres.

One example of nonlinear materials for fabrication of high-Q WGM resonators with optical nonlinear behaviors is calcium fluoride ($CaF_2$). This material is useful in various applications because of its use in ultraviolet lithography applications at 193 and 157 nm. Ultrapure crystals of this material suitable for wide aperture optics have been grown, and are commercially available. According to recently reported measurements on scattering in $CaF_2$ I=$3\times10^{-5}$ cm$^{-1}$ at 193 nm, extremely small scattering can be projected in the near-infrared band corresponding to the limitation of Q at the level of $10^{13}$.

Lattice absorption at this wavelength can be predicted from the position of the middle infrared multiphonon edge, and yields even smaller Q limitations. Because of residual doping and nonstoichiometry, both scattering and absorption are present and reduce the Q in actual resonators. An additional source for Q limitation may be the scattering produced by the residual surface inhomogeneities resulting from the polishing techniques. At the limit of conventional optical polishing quality (average roughness $\sigma=2$ nm), the estimates based on the waveguide model for WGM surface scattering yield Q $\sim 10^{11}$.

We studied WGM resonators fabricated with calcium fluoride and a few other crystalline materials made of $LiNbO_3$, $LiTaO_3$ and $Al_2O_3$, and measured their quality factors. $CaF_2$ resonators were fabricated by core-drilling of cylindrical preforms and subsequent polishing of the rim of the preforms into spheroidal geometry. The fabricated resonators had a diameter of 4-7 millimeters and a thickness of 0.5-1 mm. The fabricated Calcium fluoride resonators had a Q factor of about $2\times 10^{10}$.

Measurement of the Q was done using the prism coupling method. The intrinsic Q was measured from the bandwidth of the observed resonances in the undercoupled regime. Because of different refraction indices in resonators, we used BK7 glass prisms (n=1.52) for silica (n=1.44) and calcium fluoride (n=1.43), diamond (n=2.36) for lithium niobate (n=2.10, 2.20), and lithium niobate prism (n=2.10) for sapphire (n=1.75). We used extended cavity diode lasers at 760 nm, distributed feedback semiconductor lasers at 1550 nm, and solid-state YAG lasers at 1319 nm as the light source.

A high-Q nonlinear WGM resonators can be used for achieving low-threshold optical hyperparametric oscillations. The oscillations result from the resonantly enhanced four-wave mixing occurring due to the Kerr nonlinearity of the material. Because of the narrow bandwidth of the resonator modes as well as the high efficiency of the resonant frequency conversion, the oscillations produce stable narrowband beat-note of the pump, signal, and idler waves. A theoretical model for this process is described.

Realization of efficient nonlinear optical interactions at low light levels has been one of the main goals of non-linear optics since its inception. Optical resonators contribute significantly to achieving this goal, because confining light in a small volume for a long period of time leads to increased nonlinear optical interactions. Optical whispering gallery mode (WGM) resonators are particularly well suited for the purpose. Features of high quality factors (Q) and small mode volumes have already led to the observation of low-threshold lasing as well as efficient nonlinear wave mixing in WGM resonators made of amorphous materials.

Optical hyperparametric oscillations, dubbed as modulation instability in fiber optics, usually are hindered by small nonlinearity of the materials, so high-power light pulses are required for their observation. Though the nonlinearity of $CaF_2$ is even smaller than that of fused silica, we were able to observe with low-power continuous wave pump light a strong nonlinear interaction among resonator modes resulting from the high Q ($Q>5\times 10^9$) of the resonator. New fields are generated due to this interaction.

The frequency of the microwave signal produced by mixing the pump and the generated side-bands on a fast photodiode is stable and does not experience a frequency shift that could occur due to the self- and cross-phase modulation effects. Conversely in, e.g., coherent atomic media, the oscillations frequency shifts to compensate for the frequency mismatch due to the cross-phase modulation effect (ac Stark shift). In our system the oscillation frequency is given by the mode structure and, therefore, can be tuned by changing the resonator dimensions. Different from resonators fabricated with amorphous materials and liquids, high-Q crystalline resonators allow for a better discrimination of the third-order nonlinear processes and the observation of pure hyperparametric oscillation signals. As a result, the hyperoscillator is promising for applications as an all-optical secondary frequency reference.

The hyperparametric oscillations could be masked with stimulated Raman scattering (SRS) and other non-linear effects. For example, an observation of secondary lines in the vicinity of the optical pumping line in the SRS experiments with WGM silica microresonators was interpreted as four-wave mixing between the pump and two Raman waves generated in the resonator, rather than as the four-photon parametric process based on electronic Kerr nonlinearity of the medium. An interplay among various stimulated nonlinear processes has also been observed and studied in droplet spherical microcavities.

The polarization selection rules together with WGM's geometrical selection rules allow for the observation of nonlinear processes occurring solely due to the electronic nonlinearity of the crystals in crystalline WGM resonators. Let us consider a fluorite WGM resonator possessing cylindrical symmetry with symmetry axis. The linear index of refraction in a cubic crystal is uniform and isotropic, therefore the usual description of the modes is valid for the resonator. The TE and TM families of WGMs have polarization directions parallel and orthogonal to the symmetry axis, respectively. If an optical pumping light is sent into a TE mode, the Raman signal cannot be generated in the same mode family because in a cubic crystal such as $CaF_2$ there is only one, triply degenerate, Raman-active vibration with symmetry $F_{2g}$. Finally, in the ultrahigh Q crystalline resonators, due to the material as well as geometrical dispersion, the value of the free spectral range (FSR) at the Raman detuning frequency differs from the FSR at the carrier frequency by an amount exceeding the mode spectral width. Hence, frequency mixing between the Raman signal and the carrier is strongly suppressed. Any field generation in the TE mode family is due to the electronic nonlinearity only, and Raman scattering occurs in the TM modes.

Consider three cavity modes: one nearly resonant with the pump laser and the other two nearly resonant with the generated optical sidebands. Our analysis begins with the following equations for the slow amplitudes of the intracavity fields $$\dot{A}=\Gamma_0 A+ig[|A|^2+2|B_+|^2+2|B_-|^2]A+2igA^*B_+B_-+F_0.$$

$$\dot{B}_+=-\Gamma_+B_++ig[|2|A|^2+|B_+|^2+2|B_-|^2-]B_++igB_-^*|A|^2.$$

$$\dot{B}_-=-\Gamma_-B_-+ig[|2|A|^2+2|B_+|^2+|B_-|^2-]B_-+igB_+^*|A|^2.$$

where $\Gamma_o=i(\omega_o-\omega)+K_o$ and $\Gamma_\pm=i(\omega_\pm-)+K_\pm$, $K_o$, $K_+$, and $y_-$ as well as $\omega_o$, $\omega_+$, and $\omega_-$ are the decay rates and eigen frequencies of the optical cavity modes respectively; $\omega$ is the carrier of the external pump (A), $\omega_\pm$ and $\omega_-$ and are the carrier frequencies of generated light ($B_+$ and $B_-$, respectively). These frequencies are determined by the oscillation process and cannot be controlled from the outside. However, there is a relation between them (energy conservation law): $2\omega=\omega_++\omega_\pm$. Dimensionless slowly varying amplitudes A, $B_+$, and $B_-$ are normalized such that $|A|^2$, $|B_+|^2$, and $|B_-|^2$ describe photon number in the corresponding modes. The coupling constant can be found from the following expression $$g=\hbar \omega_0^2 n_2 c/Vn_0^2$$

where $n_2$ is an optical constant that characterizes the strength of the optical nonlinearity, $n_o$ is the linear refractive index of the material, V is the mode volume, and c is the speed of light in the vacuum. Deriving this coupling constant we assume that the modes are nearly overlapped geometrically, which is true if the frequency difference between them is small. The force $F_o$ stands for the external pumping of the system $F_o=(2K_o P_o/\omega_o)^{1/2}$, where $P_o$ is the pump power of the mode applied from the outside.

For the sake of simplicity we assume that the modes are identical, i.e., $K_+=K_-=K_o$, which is justified by observation with actual resonators. Then, solving the set (1)-(3) in steady state we find the oscillation frequency for generated fields $$\omega - \tilde{\omega}_- = \tilde{\omega}_+ - \omega = \frac{1}{2}(\omega_+ - \omega_-),$$

i.e., the beat-note frequency depends solely on the frequency, difference between the resonator modes and does not depend on the light power or the laser detuning from the pumping mode. As a consequence, the electronic frequency lock circuit changes the carrier frequency of the pump laser but does not change the frequency of the beat note of the pumping laser and the generated sidebands.

The threshold optical power can be found from the steady state solution of the set of three equations for the slow amplitudes of the intracavity fields:

$$P_{th} \simeq 1.54 \frac{\pi}{2} \frac{n_0^2 V}{n_2 \lambda Q^2},$$

where the numerical factor 1.54 comes from the influence of the self-phase modulation effects on the oscillation threshold. The theoretical value for threshold in our experiment is $P_{th} \approx 0.3$ mW, where $n_o=1.44$ is the refractive index of the material, $n_2=3.2\times10^{-16}$ cm$^2$/W is the nonlinearity coefficient for calcium fluoride, $V=10^{-4}$ cm$^3$ is the mode volume, $Q=6\times 10^9$, and $\Sigma=1.32$ μm.

The above equation suggests that the efficiency of the parametric process increases with a decrease of the mode volume. We used a relatively large WGM resonator because of the fabrication convenience. Reducing the size of the resonator could result in a dramatic reduction of the threshold for the oscillation. Since the mode volume may be roughly estimated as $V=2\pi\Sigma R^2$, it is clear that reducing the radius R by an order of magnitude would result in 2 orders of magnitude reduction in the threshold of the parametric process. This could place WGM resonators in the same class as the oscillators based on atomic coherence. However, unlike the frequency difference between sidebands in the atomic oscillator, the frequency of the WGM oscillator could be free from power (ac Stark) shifts.

Analysis based on the Langevin equations describing quantum behavior of the system suggests that the phase diffusion of the beat-note is small, similar to the low phase diffusion of the hyperparametric process in atomic coherent media. Close to the oscillation threshold the phase diffusion coefficient is $$D_{beat} \simeq \frac{\gamma_0^2}{4} \frac{\hbar \omega_0}{P_{B\,out}},$$

where $P_{Bout}$ is the output power in a sideband. The corresponding Allan deviation is $\sigma_{beat}/\omega_{beat}=(2D_{beat}/t\omega^2_{beat})^{1/2}$. We could estimate the Allan deviation as follows:

$$\sigma_{beat}/\omega_{beat} \approx 10^{-13}/\sqrt{t}$$

for $K_0=3\times10^5$ rad/s, $P_{Bout}=1$ mW, $\omega_0=1.4\times10^{15}$ rad/s and $\omega_{beat}=5\times10^{10}$ rad/s. Follow up studies of the stability of the oscillations in the general case will be published elsewhere.

Our experiments show that a larger number of modes beyond the above three interacting modes could participate in the process. The number of participating modes is determined by the variation of the mode spacing in the resonator. Generally, modes of a resonator are not equidistant because of the second order dispersion of the material and the geometrical dispersion. We introduce $D=(2\omega_o-\omega_+-\omega_-)/K_o$ to take the second order dispersion of the resonator into account. If $|D|\geq 1$ the modes are not equidistant and, therefore, multiple harmonic generation is impossible.

Geometrical dispersion for the main mode sequence of a WGM resonator is $D \approx 0.41 c/(K_0 R n_0 m^{5/3})$, for a resonator with radius R; $\omega_+$, $w_0$, and $W_-$ are assumed to be m+1, m, and m−1 modes of the resonator ($\omega_m R n_{\omega m}=mc$, m$\gg$1). For R=0.4 cm, $K_0=2\times10^5$ rad/s, m=$3\times10^4$ we obtain D=$7\times10^{-4}$, therefore the geometrical dispersion is relatively small in our case. However, the dispersion of the material is large enough. Using the Sellmeier dispersion equation, we find D≈0.1 at the pump laser wavelength. This implies that approximately three sideband pairs can be generated in the system (we see only two in the experiment).

Furthermore, the absence of the Raman signal in our experiments shows that effective Raman nonlinearity of the medium is lower than the value measured earlier. Theoretical estimates based on numbers from predict nearly equal pump power threshold values for both the Raman and the hyperparametric processes. Using the expression derived for SRS threshold $P_R \sim \pi 2 n_0^2 V/G\Sigma^2 Q^2$, where $G \sim 2\times10^{-11}$ cm/W is the Raman gain coefficient for $CaF_2$, we estimate $P_{th}/P_R \approx 1$ for any resonator made of $CaF_2$. However, as mentioned above, we did not observe any SRS signal in the experiment.

Therefore, because of the long interaction times of the pumping light with the material, even the small cubic nonlinearity of $CaF_2$ results in an efficient generation of narrowband optical sidebands. This process can be used for the demonstration of a new kind of an all-optical frequency reference. Moreover, the oscillations are promising as a source of squeezed light because the sideband photon pairs generated in the hyperparametric processes are generally quantum correlated.

Photonic microwave oscillators can be built based on generation and subsequent demodulation of polychromatic light to produce a well defined and stable beat-note signal. Hyperparametric oscillators based on nonlinear WGM optical resonators can be used to generate ultrastable microwave signals. Such microwave oscillators have the advantage of a small size and low input power, and can generate microwave signals at any desired frequency, which is determined by the size of the resonator.

Hyperparametric optical oscillation is based on four-wave mixing among two pump, signal, and idler photons by transforming two pump photos in a pump beam into one signal photon and one idler photon. This mixing results in the growth of the signal and idler optical sidebands from vacuum fluctuations at the expense of the pumping wave. A high intracavity intensity in high finesse WGMs results in $\chi(3)$ based four-photon processes like $h\omega+h\omega \rightarrow h(\omega+\omega M)+h(\omega-\omega M)$, where $\omega$ is the carrier frequency of the external pumping, and $\omega M$ is determined by the free spectral range of the resonator $\omega M=\Omega FSR$. Cascading of the process and generating multiple equidistant signal and idler harmonics (optical comb) is also possible in this oscillator. Demodulation of the optical output of the oscillator by means of a fast photodiode results in the generation of high frequency microwave signals at frequency ωM. The spectral purity of the signal increases with increasing Q factor of the WGMs and the optical power of the generated signal and idler. The pumping threshold of the oscillation can be as small as microWatt levels for the resonators with ultrahigh Q-factors.

There are several problems hindering the direct applications of the hyperparametric oscillations. One of those problems is related to the fact that the optical signal escaping WGM resonator is mostly phase modulated. Therefore, a direct detection of the signal on the fast photodiode does not result in generation of a microwave. To go around this discrepancy, the nonlinear WGM resonator can be placed in an arm of a Mach-Zehnder interferometer with an additional delay line in another arm of the interferometer. The optical interference of the light from the two arms allows transforming phase modulated signal into an amplitude modulated signal which can be detected by an optical detector to produce a microwave signal.

Figure 6:
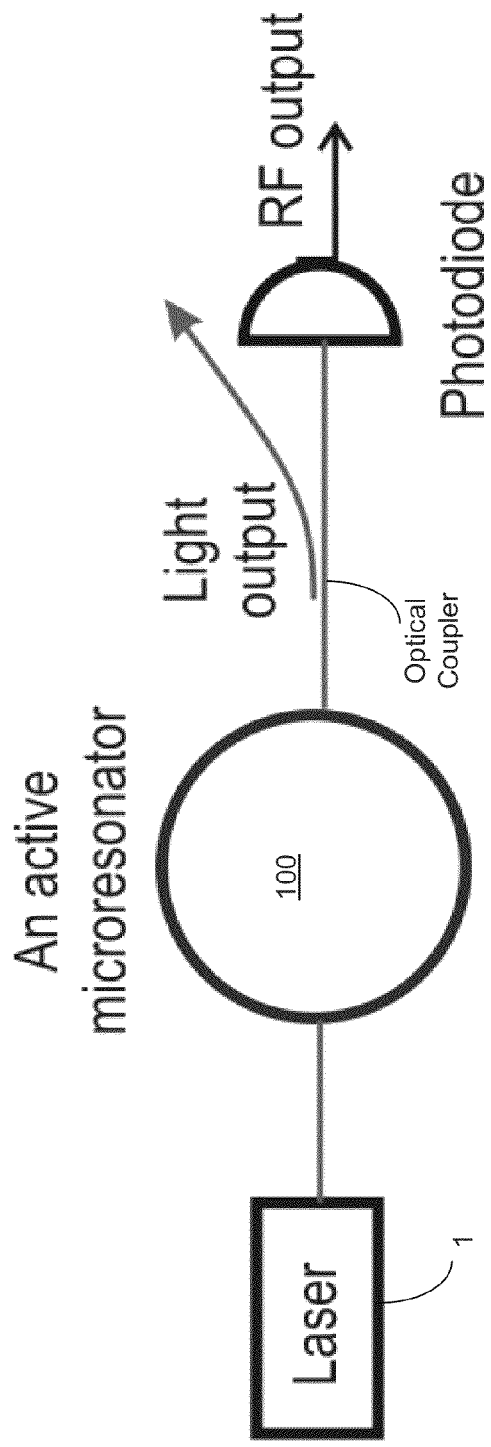
FIG. 6 shows an RF oscillator based on a nonlinear WGM resonator without an OEO loop.

FIG. 6 shows an example of a nonlinear WGM resonator in a RF photonic oscillator. A laser 1 is used to direct laser light into the nonlinear WGM resonator 100. An optical coupler is used to split the output light from the WGM resonator 100 into an optical output of the device and another beam to a photodiode for generating the RF output of the device. There is no external RF loop in this particular RF oscillator. The oscillator generates several optical harmonics within the active optical microresonator. The RF signal is generated by demodulating the harmonics on the fast photodiode. Such a device can be used to construct various devices such as a hyper-parametric oscillator, a mode-locked (Raman) laser, an opto-mechanical oscillator, a strongly-nondegenerate RF-optical parametric oscillator, etc. These devices generate optical harmonics with frequencies slightly different from the frequency of the optical pump, by taking energy from the optical pump. The demodulated optical signal becomes a source of stable RF signal.

Figure 7:
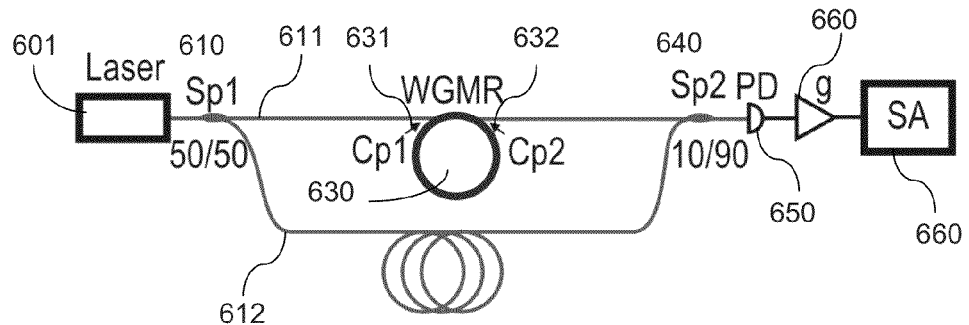
FIGS. 7, 8 and 9 show examples of RF or microwave oscillators based on nonlinear WGM resonators.

FIG. 7 shows an example of a hyperparametric microwave photonic oscillator in an optical interferometer configuration with a first optical path 1611 having the nonlinear WGM resonator 630 and a second optical path 612 with a long delay line. Light from a laser 601 is split into the two paths 611 and 612. Two coupling prisms 631 and 632 or other optical couplers can be used to optically couple the resonator 630 to the first optical path 611. The output light of the resonator 630 is collected into a single-mode fiber after the coupling prism 632 and is combined with the light from the optical delay line. The combined light is sent to a photodiode PD 650 which produces a beat signal as a narrow-band microwave signal with low noise. A signal amplifier 660 and a spectrum analyzer 660 can be used downstream from the photodiode 650.

Figure 8:
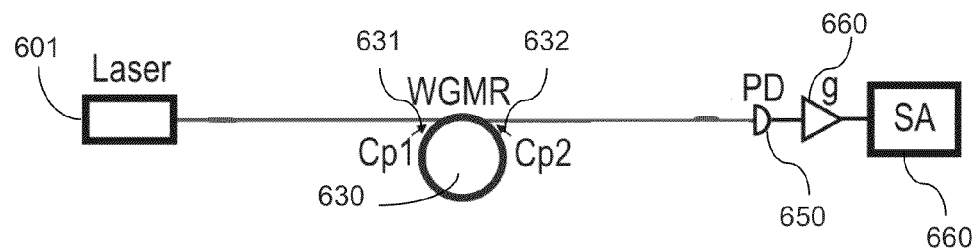

FIG. 8 shows an example of a hyperparametric microwave photonic oscillator in which the oscillator is able to generate microwave signals without a delay in the above interferometer configuration in FIG. 7. This simplifies packaging the device.

Figure 9:
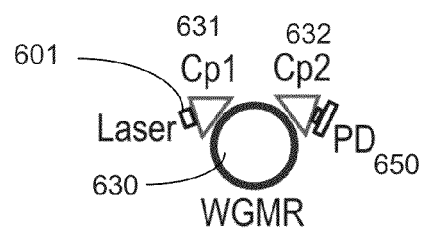

FIG. 9 shows an oscillator where a laser diode 601 is directly coupled to an optical coupling element CP1 (631, e.g., a coupling prism) that is optically coupled to the WDM nonlinear resonator 630 and a second optical coupling element CP2 (632, e.g., a coupling prism) is coupled to the resonator 630 to produce an optical output. The photodiode PD 650 is coupled to the CP2 to convert the optical output received by the photodiode 650 into a low noise RF/microwave signal.

The above designs without the optical delay line or OEO loops can be based on single sideband four wave mixing process occurring in the resonators. A single sideband signal does not require any interferometric technique to generate a microwave signal on the photodiode.

The hyperparametric oscillator produces a high spectral purity for the microwave signal generated at the output of the photodetector. We have measured phase noise of the signals and found that it is shot noise limited and that the phase noise floor can reach at least −126 dBc/Hz level. To improve the spectral purity we can oversaturate the oscillator and generate an optical comb. Microwave signals generated by demodulation of the optical comb have better spectral purity compared with the single-sideband oscillator. Optical comb corresponds to mode locking in the system resulting in phase locked optical harmonics and generation of short optical pulses. We have found that the phase noise of the microwave signal generated by the demodulation of the train of optical pulses with duration t and repetition rate T is given by shot noise with a power spectral density given by $$S_\phi(\omega) \approx \frac{2\hbar\omega_0}{P_{ave}\omega^2} \frac{4\pi^2 \alpha t^2}{T^4}$$

where ω0 is the frequency of the optical pump, $P_{ave}$ is the averaged optical power of the generated pulse train, α is the round trip optical loss. Hence, the shorter is the pulse compared with the repetition rate the smaller is the phase noise. On the other hand we know that T/t is approximately the number of modes in the comb N. Hence, we expect that the comb will have much lower (N^2) phase noise compared with usual hyperparametric oscillator having one or two sidebands.

Nonlinear WGM resonators with the third order nonlinearities, such as CaF2 WGM resonators, can be used to construct tunable optical comb generators. A CaF2 WGM resonator was used to generate optical combs with 25 m GHz frequency spacing (m is an integer number). The spacing (the number m) was changed controllably by selecting the proper detuning of the carrier frequency of the pump laser with respect to a selected WGM frequency. Demodulation of the optical comb by means of a fast photodiode can be used to generate high-frequency microwave signals at the comb repetition frequency or the comb spacing. The linewidth of generated 25 GHz signals was less than 40 Hz.

Such a comb generator includes a laser to produce the pump laser beam, a nonlinear WGM resonator and an optical coupling module to couple the pump laser beam into the nonlinear WGM resonator and to couple light out of the nonlinear WGM resonator. Tuning of the frequencies in the optical comb can be achieved by tuning the frequency of the pump laser beam and the comb spacing can be adjusted by locking the pump laser to the nonlinear WGM resonator and controlling the locking condition of the pump laser.

When the WGM resonator is optically pumped at a low input level when the pumping power approaches the threshold of the hyperparametric oscillations, no optical comb is generated and a competition of stimulated Raman scattering (SRS) and the FWM processes is observed. The WGM resonator used in our tests had multiple mode families of high Q WGMs. We found that SRS has a lower threshold compared with the FWM oscillation process in the case of direct pumping of the modes that belong to the basic mode sequence. This is an unexpected result because the SRS process has a somewhat smaller threshold compared with the hyperparametric oscillation in the modes having identical parameters. The discrepancy is due to the fact that different mode families have different quality factors given by the field distribution in the mode, and positions of the couplers. The test setup was arranged in such a way that the basic sequence of the WGMs had lower Q factor (higher loading) compared with the higher order transverse modes. The SRS process starts in the higher-Q modes even though the modes have larger volume V. This happens because the SRS threshold power is inversely proportional to $VQ^2$.

Figure 10:
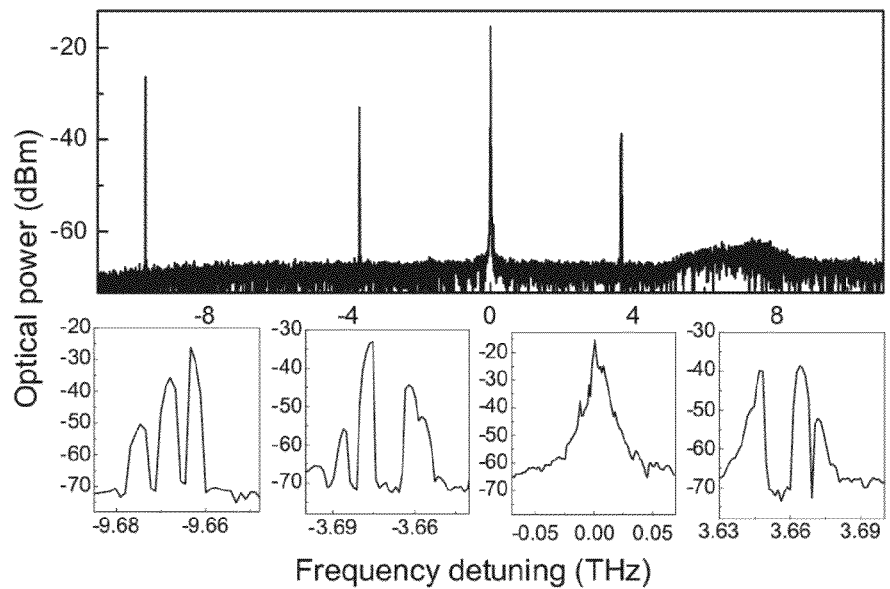
FIGS. 10-15 show measurements of sample nonlinear WGM resonators for generating optical comb signals.

Pumping of the basic mode sequence with larger power of light typically leads to hyperparametric oscillation taking place along with the SRS. FIG. 10 shows a measured frequency spectrum of the SRS at about 9.67 THz from the optical carrier and hyperparametric oscillations observed in the CaF2 resonator pumped to a mode belonging to the basic mode sequence. The structure of the lines is shown by inserts below the spectrum. The loaded quality factor Q was $10^9$ and the pump power sent to the modes was 8 mW. Our tests indicated that hyperparametric and SRS processes start in the higher Q modes. The frequency separation between the modes participating in these processes is much less than the FSR of the resonator and the modes are apparently of transverse nature. This also explains the absence of FWM between the SRS light and the carrier.

The photon pairs generated by FWM are approximately 8 THz apart from the pump frequency as shown in FIG. 10. This is because the CaF2 has its zero-dispersion point in the vicinity of 1550 nm. This generation of photon pairs far away from the pump makes the WGM resonator-based hyperparametric oscillator well suited for quantum communication and quantum cryptography networks. The oscillator avoids large coupling losses occurring when the photon pairs are launched into communication fibers, in contrast with the traditional twin-photon sources based on the $\chi(2)$ down-conversion process. Moreover, a lossless separation of the narrow band photons with their carrier frequencies several terahertz apart can be readily obtained.

In the tests conducted, optical combs were generated when the pump power increased far above the oscillation threshold. Stable optical combs were generated when the frequency of the laser was locked to a high Q transverse WGM. In this way, we observed hyperparametric oscillation with a lower threshold compared with the SRS process. Even a significant increase of the optical pump power did not lead to the onset of the SRS process because of the fast growth of the optical comb lines.

Figure 11:
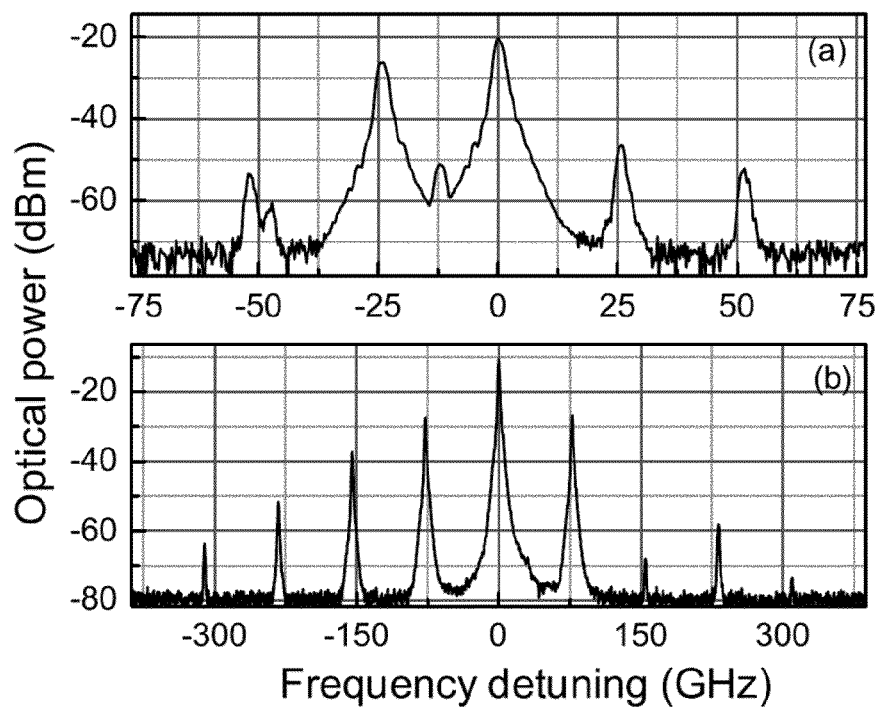

FIG. 11 shows examples of hyperparametric oscillation observed in the resonator pumped with 10 mW of 1550 nm light. Spectra (a) and (b) correspond to different detuning of the pump from the WGM resonant frequency. The measured spectrum (a) shows the result of the photon summation process when the carrier and the first Stokes sideband, separated by 25 GHz, generate photons at 12.5 GHz frequency. The process is possible because of the high density of the WGMs and is forbidden in the single mode family resonators.

The growth of the combs has several peculiarities. In some cases, a significant asymmetry was present in the growth of the signal and idler sidebands as shown in FIG. 11. This asymmetry is not explained with the usual theory of hyperparametric oscillation which predicts generation of symmetric sidebands. One possible explanation for this is the high modal density of the resonator. In the experiment the laser pumps not a single mode, but a nearly degenerate mode cluster. The transverse mode families have slightly different geometrical dispersion so the shape of the cluster changes with frequency and each mode family results in its own hyperparametric oscillation. The signal and idler modes of those oscillations are nearly degenerate so they can interfere, and interference results in sideband suppression on either side of the carrier. This results in the "single sideband" oscillations that were observed in our tests. The interfering combs should not be considered as independent because the generated sidebands have a distinct phase dependence, as is shown in generation of microwave signals by comb demodulation.

Figure 12:
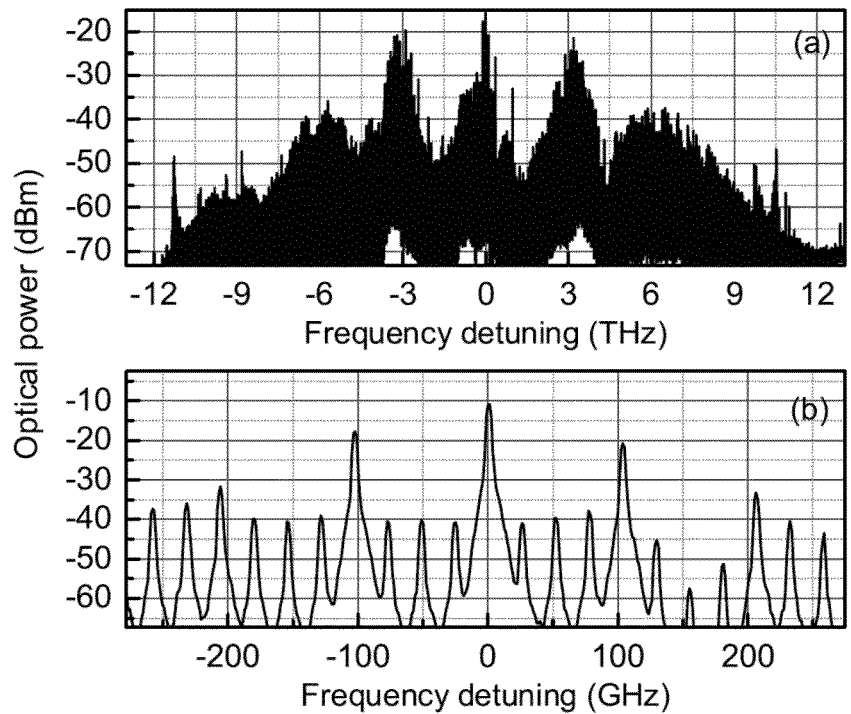
Figure 13:
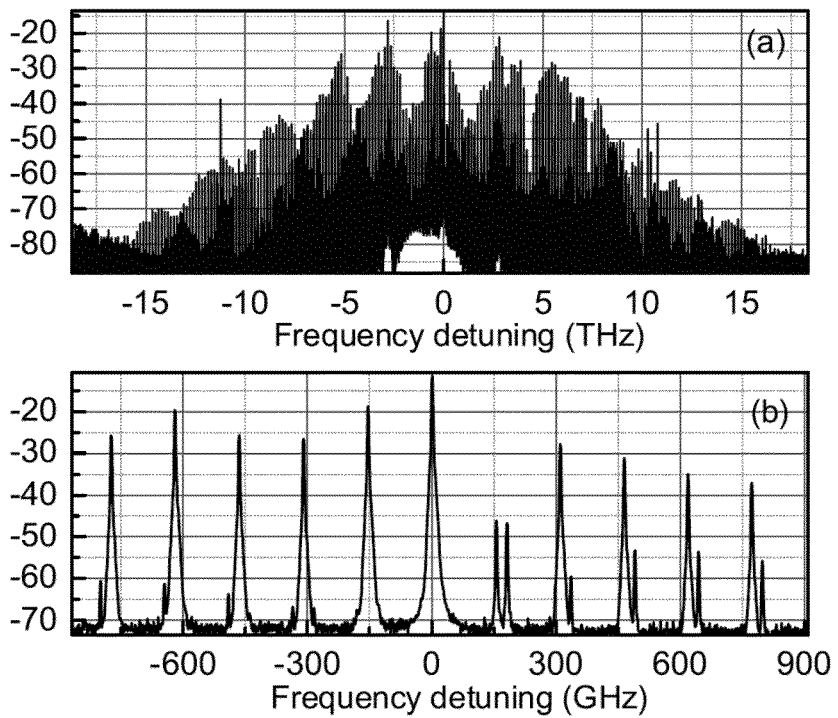

FIG. 12 shows (a) the optical comb generated by the CaF2 WGM resonator pumped at by a pump laser beam of 50 mW in power, and (b) the enlarged central part of the measurement in (a). The generated optical comb has two definite repetition frequencies equal to one and four FSRs of the resonator. FIG. 13 shows the modification of the comb shown in FIG. 12 when the level and the phase of the laser lock were changed. FIG. 13($b$) shows the enlarged central part of the measurement in FIG. 13($a$).

The interaction of the signal and the idler harmonics becomes more pronounced when the pump power is further increased beyond the pump threshold at which the single sideband oscillation is generated. FIGS. 12 and 13 show observed combs with more than 30 THz frequency span. The envelopes of the combs are modulated and the reason for the modulation can be deduced from FIG. 13($b$). The comb is generated over a mode cluster that changes its shape with frequency.

The above described nonlinear WGM resonator-based optical comb generator can be tuned and the controllable tuning of the comb repetition frequency is achieved by changing the frequency of the pump laser. Keeping other experimental conditions unchanged (e.g., the temperature and optical coupling of the resonator), the level and the phase of the laser lock can be changed to cause a change in the comb frequency spacing. The measurements shown in FIGS. 11-13 provide examples for the tuning. This tuning capability of nonlinear WGM resonator-based comb generators is useful in various applications.

Figure 14:
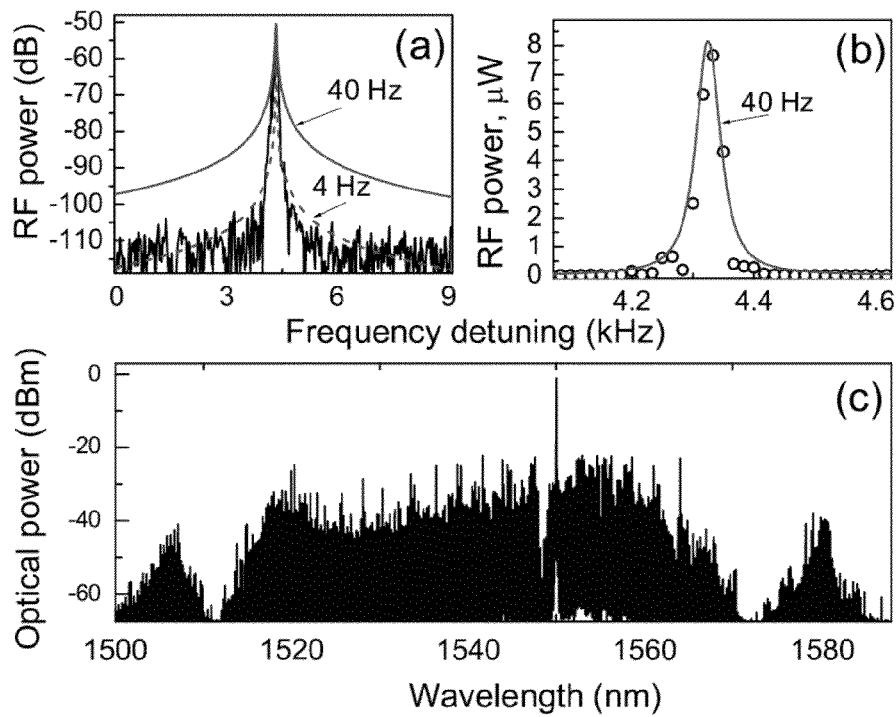

Another feature of nonlinear WGM resonator-based comb generators is that the different modes of the optical comb are coherent. The demodulation of the Kerr (hyperparametric) frequency comb so generated can be directly detected by a fast photodiode to produce a high frequency RF or microwave signal at the comb repetition frequency. This is a consequence and an indication that the comb lines are coherent. The spectral purity of the signal increases with increasing Q factor of the WGMs, the optical power of the generated sidebands, and the spectral width of the comb. The output of the fast photodiode is an RF or microwave beat signal caused by coherent interference between different spectral components in the comb. To demonstrate the coherent properties of the comb, a comb with the primary frequency spacing of 25 GHz was directed into a fast 40-GHz photodiode with an optical band of 1480-1640 nm. FIG. 14 shows the recorded the microwave beat signal output by the 40-GHz photodiode. FIG. 14($a$) shows the signal in the logarithmic scale and FIG. 14($b$) shows the same signal in the linear scale. FIG. 14($c$) shows the spectrum of the optical comb directed into the 40-GHz photodiode. The result of the linear fit of the microwave line indicates that the generated microwave beat signal has a linewidth less than 40 Hz, indicating high coherence of the beat signal. A microwave spectrum analyzer (Agilent 8564A) used in this experiment has a 10 Hz video bandwidth, no averaging, and the internal microwave attenuation is 10 dB (the actual microwave noise floor is an order of magnitude lower). No optical postfiltering of the optical signal was involved.

FIG. 14 also indicates that the microwave signal is inhomogeneously broadened to 40 Hz. The noise floor corresponds to the measurement bandwidth (approximately 4 Hz). The broadening comes from the thermorefractive jitter of the WGM resonance frequency with respect to the pump laser carrier frequency. The laser locking circuit based on 8-kHz modulation used in the test is not fast enough to compensate for this jitter. A faster lock (e.g., 10 MHz) may be used to allow measuring a narrower bandwidth of the microwave signal.

The comb used in the microwave generation in FIG. 14(c) has an asymmetric shape. Unlike the nearly symmetric combs in FIGS. 12 and 13, this comb is shifted to the blue side of the carrier. To produce the comb in FIG. 14(c), the laser was locked to one of the modes belonging to the basic mode sequence. We observed the two mode oscillation process as in FIG. 10 for lower pump power that transformed into the equidistant comb as the pump power was increased. The SRS process was suppressed.

Figure 15:
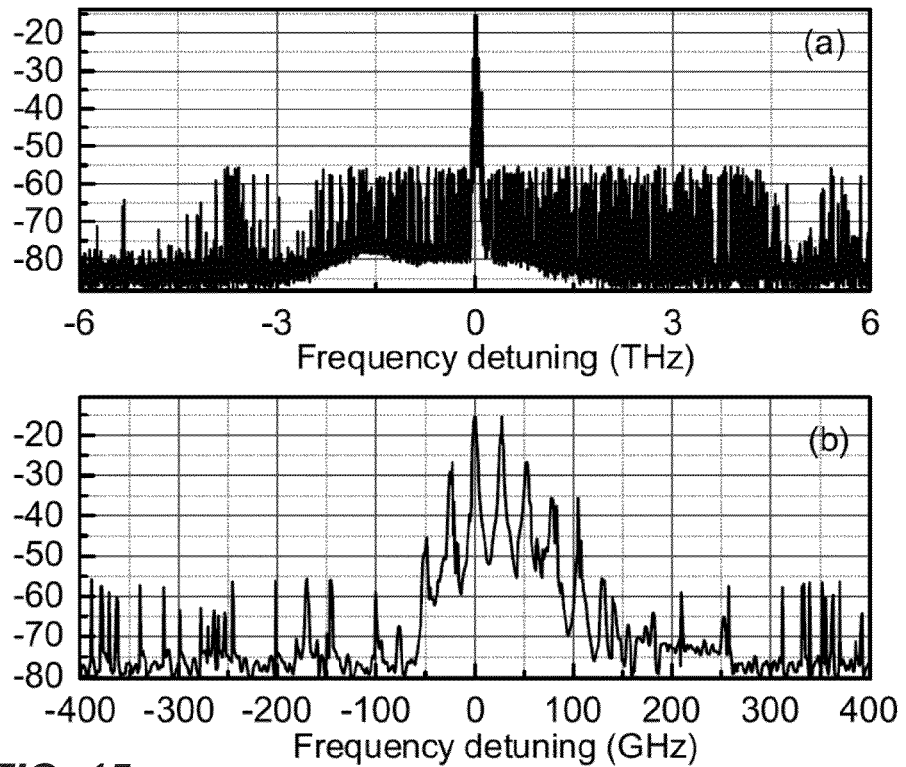

In a different test, an externally modulated light signal was sent to the nonlinear WGM resonator as the optical pump. FIG. 15 shows measured chaotic oscillations measured in the optical output of the nonlinear WGM resonator. The resonator was pumped with laser light at 1550 nm that is modulated at 25 786 kHz and has a power of 50 mW. The generated spectrum is not noticeably broader than the spectrum produced with a cw pumped resonator and the modes are not equidistant.

Therefore, optical frequency combs can be generated by optically pumping a WGM crystalline resonator to provide tunable comb frequency spacing corresponding to the FSR of the resonator. The combs have large spectral widths (e.g., exceeding 30 THz) and good relative coherence of the modes. The properties of the generated combs depend on the selection of the optically pumped mode, and the level and the phase of the lock of the laser to the resonator.

The above described generation of optical combs using optical cubic nonlinearity in WGM resonators can use laser locking to stabilize the frequencies of the generated optical comb signals. A Pound-Drever-Hall (PDH) laser feedback locking scheme can be used to lock the laser that produces the pump light to the nonlinear WGM resonator. The PDH locking is an example of laser locking techniques based on a feedback locking circuit that uses the light coupled of the resonator to produce an electrical control signal to lock the laser to the resonator. The level and the phase of the lock are different for the oscillating and non-oscillating resonators. Increasing the power of the locked laser above the threshold of the oscillation causes the lock instability. This locking of the laser can facilitate generation of spectrally pure microwave signals. Tests indicate that the unlocked comb signals tend to have border linewidths (e.g., about MHz) than linewidths generated by a comb generator with a locked laser, e.g., less than 40 Hz as shown in FIG. 14.

Alternative to the Pound-Drever-Hall (PDH) laser feedback locking, Rayleigh scattering inside a WGM resonator or a solid state ring resonator can be used to lock a laser to such a resonator in a form of self injection locking. This injection locking locks a laser to a nonlinear resonator producing a hyperparametric frequency comb by injecting light of the optical output of the nonlinear resonator under optical pumping by the laser light of the laser back into the laser under a proper phase matching condition. The optical phase of the feedback light from the nonlinear resonator to the laser is adjusted to meet the phase matching condition.

Two feedback mechanisms can be used to direct light from the nonlinear resonator to the laser for locking the laser. The first feedback mechanism uses the signal produced via Rayleigh scattering inside the nonlinear resonator. The light caused by the Rayleigh scattering traces the optical path of the original pump light from the laser to travel from the nonlinear resonator to the laser.

Figure 16:
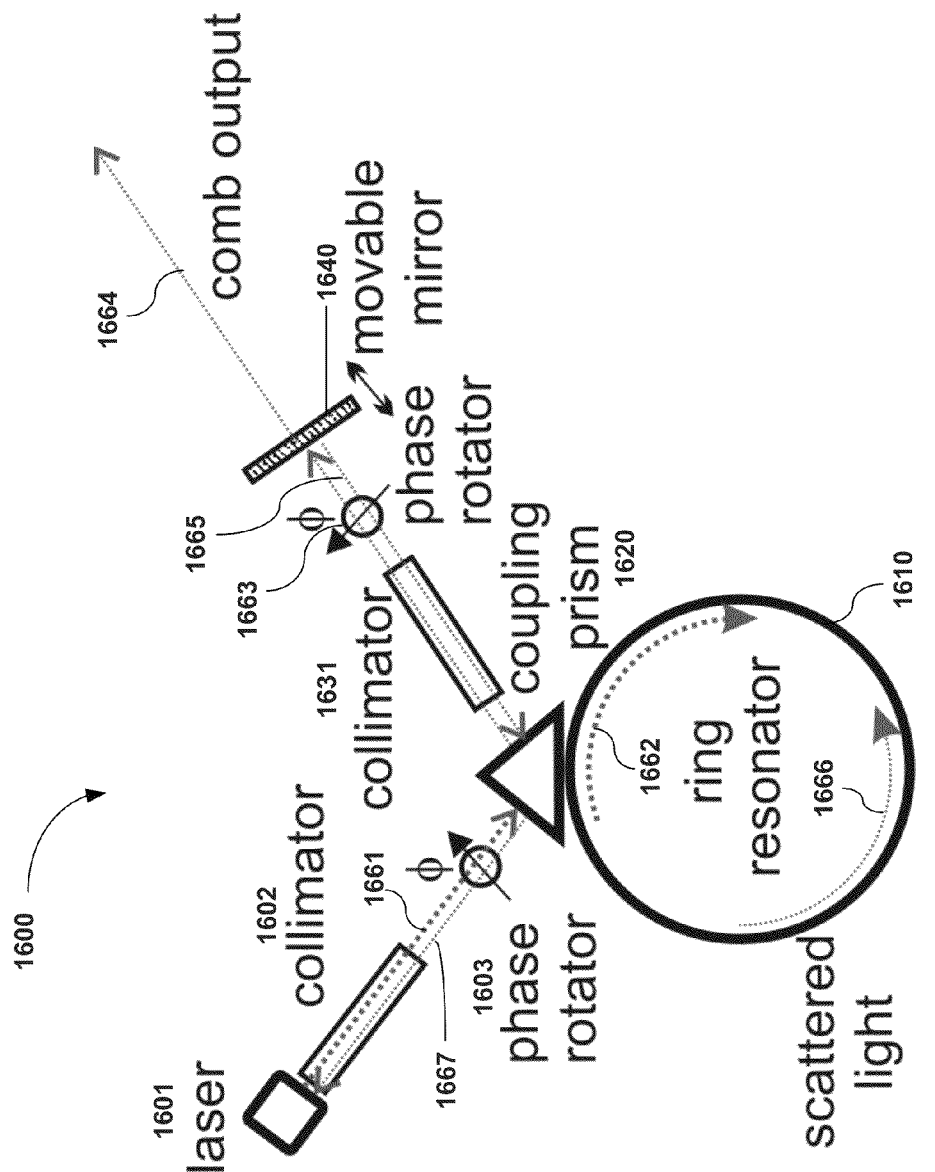
FIG. 16 shows an example for locking a laser to a resonator by using an external reflector.

The second feedback mechanism uses a reflector, e.g., an additional partially transparent mirror, placed at the output optical path of the nonlinear resonator to generate a reflection back to the nonlinear resonator and then to the laser. FIG. 16 shows an example of a device 1600 that locks a laser 1601 to a nonlinear resonator 1610. The nonlinear resonator 1610 can be a ring resonator, a disk resonator, a spherical resonator or non-spherical resonator (e.g., a spheroid resonator). An optical coupler 1620, which can be a coupling prism as shown, is used to provide optical input to the resonator 1610 and to provide optical output from the resonator 1610. The laser 1601 produces and directs a laser beam 1661 to the coupling prism 1620 which couples the laser beam 1661 into the resonator 1610 as the beam 1662 circulating in the counter-clock wise direction inside the resonator 1610. The light of the circulating beam 1662 is optically coupled out by the optical coupler 1620 as a resonator output beam 1665. A reflector 1640 is placed after the coupling prism 1620 in the optical path of the resonator output beam 1665 to reflect at least a portion of the resonator output beam 1665 back to the coupling prism 1620. Optical collimators 1602 and 1631 can be used to collimate the light. The reflector 1640 can be a partial reflector to transmit part of the resonator output beam 1663 as an output beam 1664 and to reflect part of the resonator output beam as a returned beam 1665. The reflector 1640 may also be a full reflector that reflects all light of the beam 1663 back as the returned beam 1665. The feedback beam 1665 is coupled into the resonator 1610 as a counter propagating beam 1666 which is coupled by the coupling prism 1620 as a feedback beam 1667 towards the laser 1601. The feedback beam 1667 enters the laser 1601 and causes the laser to lock to the resonator 1610 via injecting locking.

The above laser locking based on optical feedback from the nonlinear resonator 1610 based on either the Rayleigh scattering inside the resonator 1610 or the external reflector 1640 can be established when the optical phase of the feedback beam 1667 from the resonator 1610 to the laser 1601 meets the phase matching condition for the injection locking. A phase control mechanism can be implemented in the optical path of the feedback beam 1667 in the Rayleigh scattering scheme or one or more beams 1661, 1662, 1663, 1665, 1666 and 1667 in the scheme using the external reflector 1640 to adjust and control the optical phase of the feedback beam 1667. As illustrated, in one implementation of this phase control mechanism, the reflector 1540 may be a movable mirror that can be controlled to change its position along the optical path of the beam 1663 to adjust the optical phase of the feedback beam 1667. The phase of the returning signal 1667 can also be adjusted either by a phase rotator 1603 placed between the laser 1601 and the coupler 1620 or a phase rotator 1663 placed between the coupler 1620 or collimator 1631 and the external reflector or mirror 1640. A joint configuration of using both the Rayleigh scattering inside the resonator 1610 and the external reflector 1640 may also be used. The selection of the configuration depends on the operating conditions including the loading of the resonator 1610 with the coupler 1620 as well as the strength of the Rayleigh scattering in the resonator 1610. Such a locking technique can be used allow avoiding technical difficulties associated with using the PDH locking and other locking designs.

The devices and techniques described in this document use optical processing to benefit the high precision and stability of optical atomic or molecular transitions in atoms or molecules in the optical domain by stabilizing an optical signal with at least two optical spectral components with a desired frequency separation. The beat between the two optical spectral components in the stabilized optical signal on a photodetector generates an RF or microwave signal with the frequency precision or stability of the atomic clock. Referring back to FIG. 1A, the optical comb generation device uses the laser 1 as the sole optical source and nonlinear optical mixing in the nonlinear WGM resonator 100 to produce optical frequencies in the optical comb. Such two or more optical spectral components may be generated without generating the optical comb signal by nonlinear wave mixing where the nonlinear optical resonator may be replaced by an optical resonator that does not exhibit optical nonlinearity. For example, two different lasers at two laser carrier frequencies can be locked to an atomic frequency reference where the frequency difference of the two laser carrier frequencies is set at the desired RF or microwave frequency.

Figure 17:
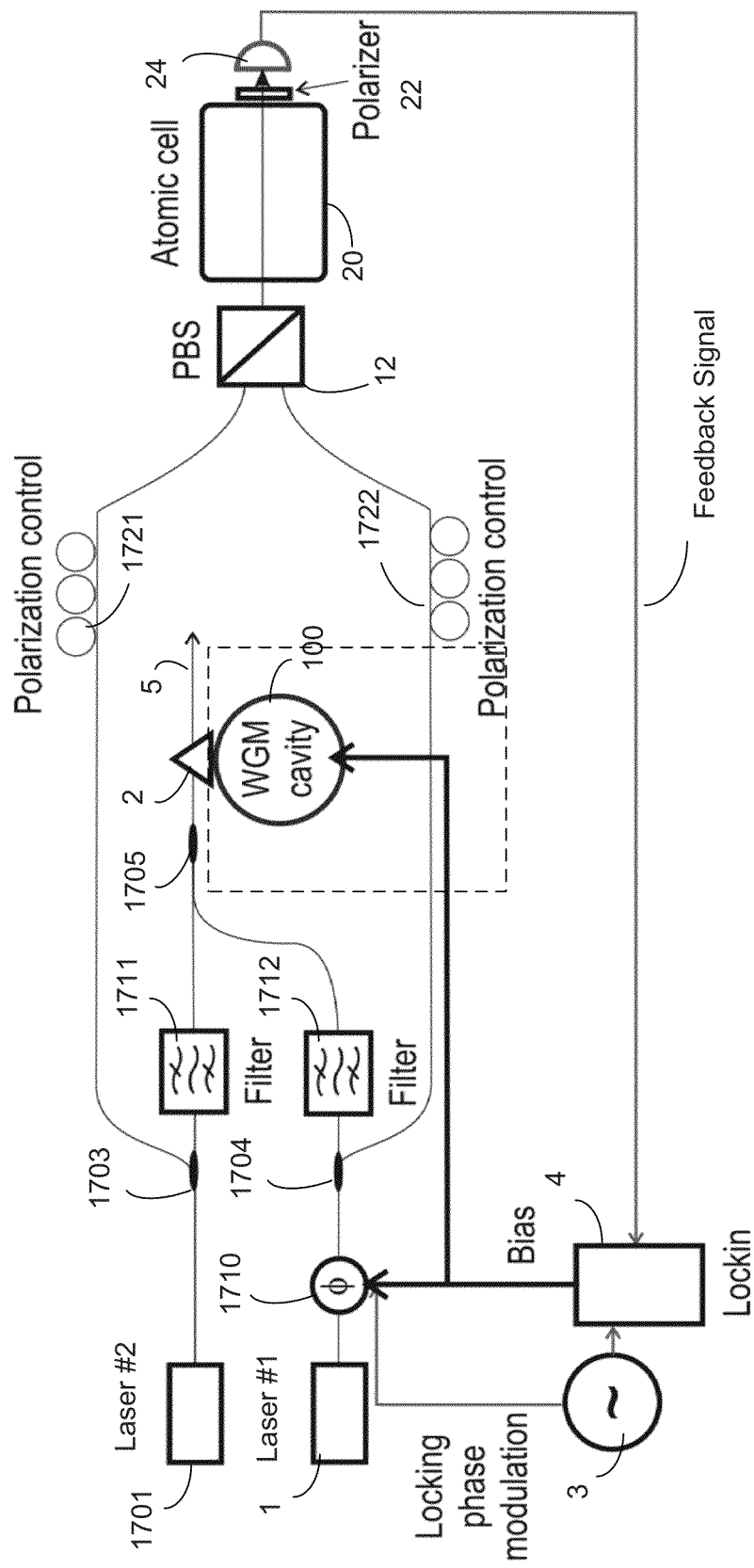
FIGS. 17, 18, 19, 20 and 21 show different optical comb generation devices that are stabilized to an atomic reference.

FIG. 17 shows a device that uses two independent lasers 1 and 1701 locked to two different modes of the resonator 100. In this example, the resonator 100 can be a linear WGM resonator. Alternatively, a nonlinear resonator 100 as in FIG. 1A may also be used. The two lasers 1 and 1701 are tuned to operate at two different optical carrier frequencies that are in resonance with the two atomic transitions sharing the same excited state, respectively. The two laser carrier frequencies are separated by the RF frequency $\omega_{RF}$ which can be equal to or be a harmonic of the FSR of the resonator 100. The first laser beam from the laser 1701 is split by a first optical coupler or splitter 1703 (e.g., a fiber coupler) into two first laser beams: one beam directed to a first polarization controller 1721 to be in a first optical polarization, another beam directed towards the optical resonator 100 via an optional first optical filter 1711. The second laser beam from the laser 1 is split by a second optical coupler or splitter 1704 (e.g., a fiber coupler) into two second laser beams: one beam directed to a second polarization controller 1722 to be in a second optical polarization that is orthogonal to the first optical polarization, and another beam directed towards the optical resonator 100 via another optional optical filter 1712. The PBS 12 combines the two orthogonally polarized beams out of the two polarization controllers 1721 and 1722 into a combined beam that is directed into the atomic cell 20 for producing the feedback signal at the detector 24.

The two beams from the two lasers that are directed towards to the resonator 100 are coupled by the optical coupler 2 into the resonator 100. An optical coupler 1705 (e.g., a fiber coupler) combines these two beams at two different laser carrier frequencies into a single beam that is coupled by the optical coupler 2 into the resonator 100. This beam has two spectral peaks at the two different laser carrier frequencies separated by the RF frequency $\omega_{RF}$ and is directed to the optical coupler 2 which couples the light into the resonator 100. The two optical filters 1711 and 1722 are optional and are provided to ensure that the two beams that are coupled into the resonator 100 via the coupler 2 are at the desired optical frequencies corresponding to the two optical atomic transitions.

In this design with two lasers 1 and 1701, the optical resonator 100 can be a passive resonator without exhibiting the nonlinearity for the optical nonlinear wave mixing since light at the two laser carrier frequencies in the output 5 can beat with each other at the photodiode 24 to generate the RF output at the RF frequency $\omega_{RF}$. Alternatively, the optical resonator 100 here may also be made a nonlinear material to cause nonlinear mixing and parametric amplification in the resonator 100 and to generate the optical comb output 5.

The lasers 1 and 1701 are locked to different modes of the resonator 100 by using a suitable locking mechanism, e.g., optical injection locking, PDH locking. The optical comb is generated via four wave mixing between the two different pumps at the two carrier frequencies. Phase locking of one laser to the other one allows realizing stable RF beat note. Locking to the atomic cell 20 leads to the absolute stability of the RF signal generated at a photodiode that receives the optical output 5 which can be an optical output with two frequencies if the resonator 100 is a linear resonator, or an optical comb if the resonator 100 is a nonlinear resonator that provides desired nonlinear wave mixing.

The feedback circuit 4 uses the feedback signal to generate the bias signal to the resonator 100. Different from FIG. 1A, a phase adjustment device 1710 is placed at the output of the laser 1 that receives the dithering signal at a dithering frequency from the signal source 3 and the bias signal from the feedback circuit 4. This phase adjustment device 1710 creates a dither in the frequency of the beam going through the polarization controller 1722 and thus a change in the feedback signal output by the detector 24 to indicate the direction and amount of the drift in the frequency of the resonator 100 which is adjusted to reduce or minimize this drift to achieve stabilization with respect to the atomic reference.

The use of a single laser and a nonlinear optical resonator (e.g., a nonlinear WGM resonator) can simplify the device structure (e.g., by using a single laser instead of two lasers and by avoiding additional circuitry for locking the two lasers relative to each other) in producing an RF or microwave with an atomic clock precision or stability. FIGS. 18-21 describe additional device designs based on generation of optical combs in nonlinear WGM resonators and locking of such optical combs to one or more atomic frequency references.

Figure 18:
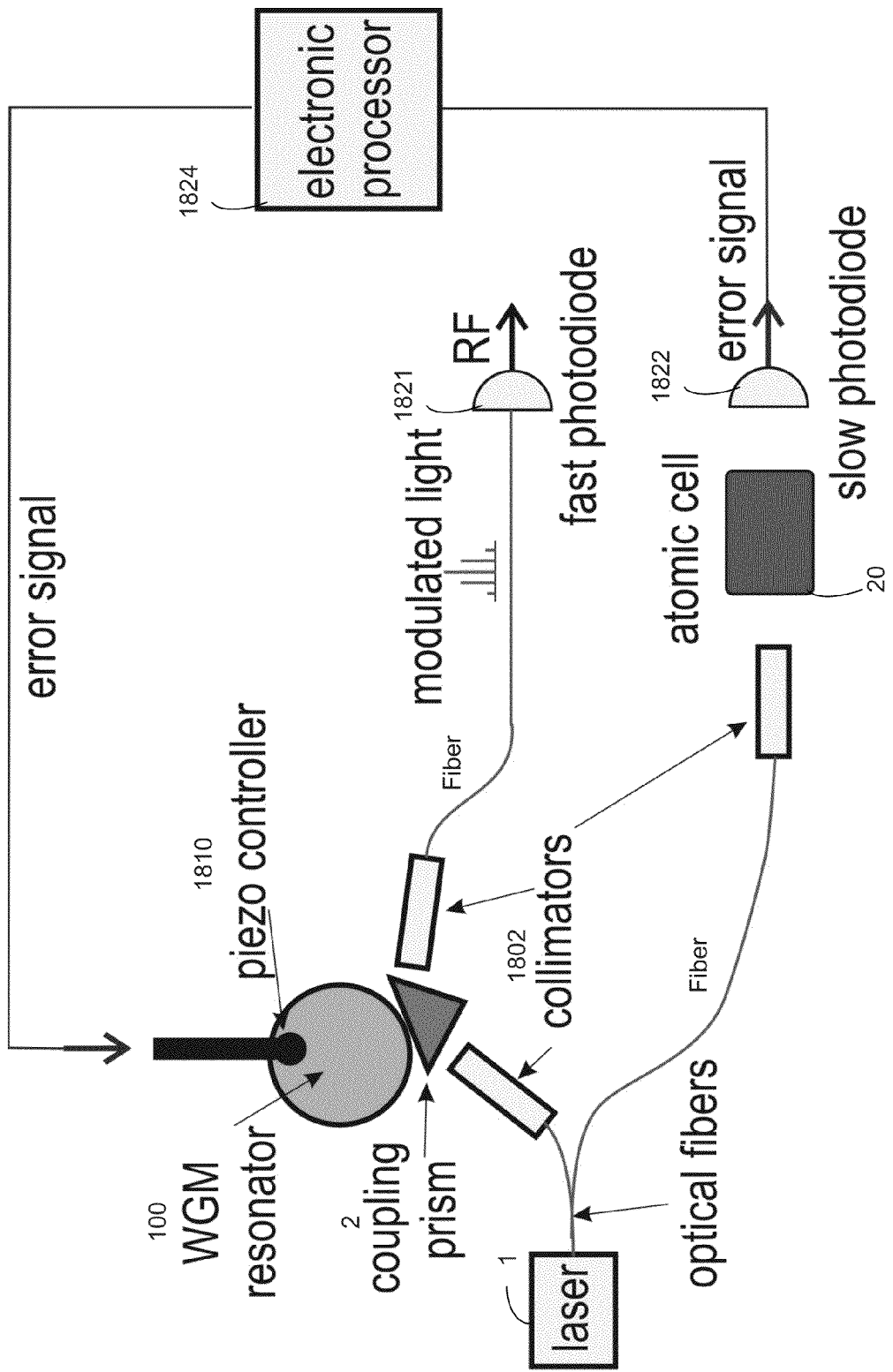

FIG. 18 shows an example of an optical comb generation device that locks the optical comb directly to an optical atomic transition, instead of the RF hyperfine transition, for its stabilization. The laser light from the laser 1 is split into two laser beams carried by two fibers: one laser beam for pumping the resonator 100 and another laser beam for generating an error signal with respect to an optical atomic transition in the atomic reference. Different from FIGS. 1A and 17, a single laser beam at the laser carrier frequency is directed through the atomic vapor cell 20 and a photodetector 1822 (e.g., a slow photodiode) is used to measure the optical transmission of the atomic cell 20. An electronic processor circuit 1824 is provided to receive the detector output of the photodetector 1822 to generate an error signal indicating a deviation of the laser carrier frequency from the atomic transition frequency. This error signal is used to operate a cavity control unit 1810 that tunes or modulates the resonance(s) of the resonator 100 where the optical comb is generated via nonlinear wave mixing and parametric amplification. Therefore, the comb harmonics are phase locked to the pumping light from the laser which is locked to an optical atomic transition via the modulation in the optical resonator 100 caused by the cavity control unit 1810 and the injection locking between the laser 1 and the resonator 100. Fiber collimators 1802 are used at terminals of the fibers for receiving or outputting laser light.

FIG. 18 shows a specific example of a piezo controller as the cavity control unit 1810. The piezo controller 1810 includes a piezo-electric actuator engaged to the resonator 100 to tune the resonator resonance. The laser 1 is locked to the resonator 100 due to injection locking based on Rayleigh scattering occurring in the resonator 100, a thermo-optical effect or a locking circuit such as the PDH locking. The frequency of the resonator 100 is slowly modulated or dithered using either piezo-optic or thermorefractive effect. The dither modulation of the resonator 100 results in the modulation of the laser frequency via feedback light from the resonator 100 to the laser 1 that leads to the injection locking. This dither modulation of the laser frequency or the resonator resonance leads to generation of the error signal by the light passing through the atomic cell 20 (the reflective Doppler free configuration not shown here will also be considered). The error signal is electronically processed by the electronic processor 1824 and fed back into the piezo controller 1810. In tests conducted, the accuracy of the locking/determination of the optical WGM frequency was about 10 Hz per second ($Q=5 \times 10^{10}$) which corresponded to the Allan variance about $10^{-14}$ $s^{-1/2}$. The RF signal generated by the modulated light on the fast photodiode had the same Allan variance.

Figure 19:
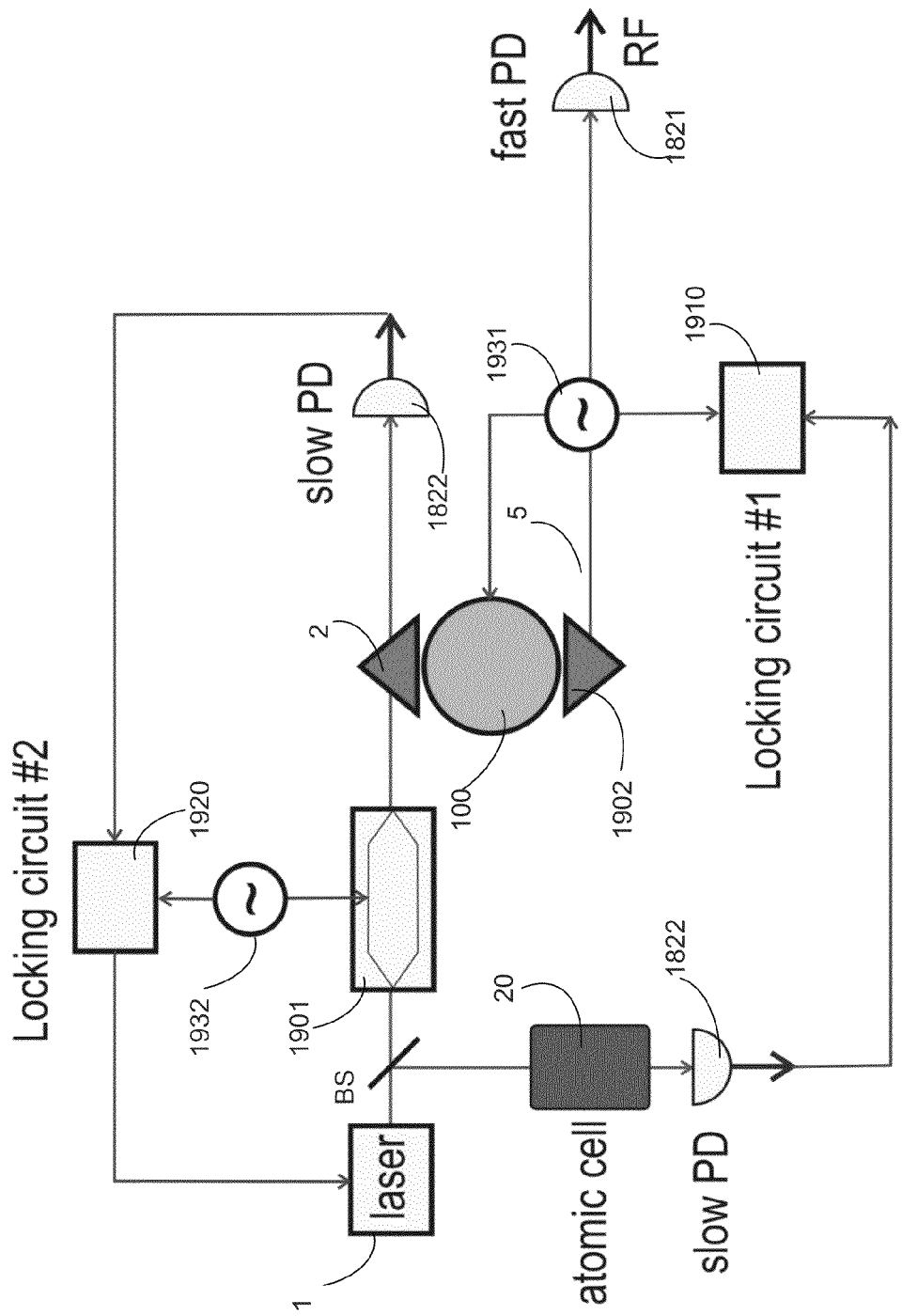

FIG. 19 shows another example of an optical comb generation device that locks the optical comb to an optical transition, instead of the RF hyperfine transition, for its stabilization. A portion of the laser light from the laser 1 is split by a beam splitter BS into a frequency monitor beam that is directed through the atomic cell 20 and a first slow photodiode 1822 is used to receive the optical transmission of the atomic cell 20 to generate a first error signal indicating a frequency deviation of the laser carrier frequency from the atomic reference. A first locking circuit 1910 is provided to use the first error signal to lock the resonator 100 to the atomic reference. In the example shown, the first locking circuit 1910 can be a PDH locking circuit.

The BS in the output of the laser 1 directs the laser light to an optical modulator 1901, e.g., an optical Mach-Zehnder modulator, that modulates the laser light to produce a dither modulation on the laser beam for generating the error signal at the output of the atomic cell 20. Hence, this optical modulator 1901 performs the similar function as the device 1710 in FIG. 17. The optical coupler 2 couples the modulated laser beam into the resonator 100 for nonlinear wave mixing and parametric amplification for generating the optical comb output 5 coupled out by another optical coupler 1902 to a fast photodetector 1821 for generating the RF output of the device. The optical coupler 2 produces an optical output that is directed to a second slow photodiode 1822 that produces a second error signal indicating a frequency deviation of the laser carrier frequency from a resonator mode of the resonator 100. A second locking circuit 1920, which can be, e.g., a PDH locking circuit, is provided to apply the second error signal to lock the laser 1 to the resonator 100. Since the resonator 100 is locked by the first locking circuit 1910 to the atomic reference, the second locking circuit 1920 also locks the laser 1 relative to the atomic reference via the resonator 100.

Figure 20:
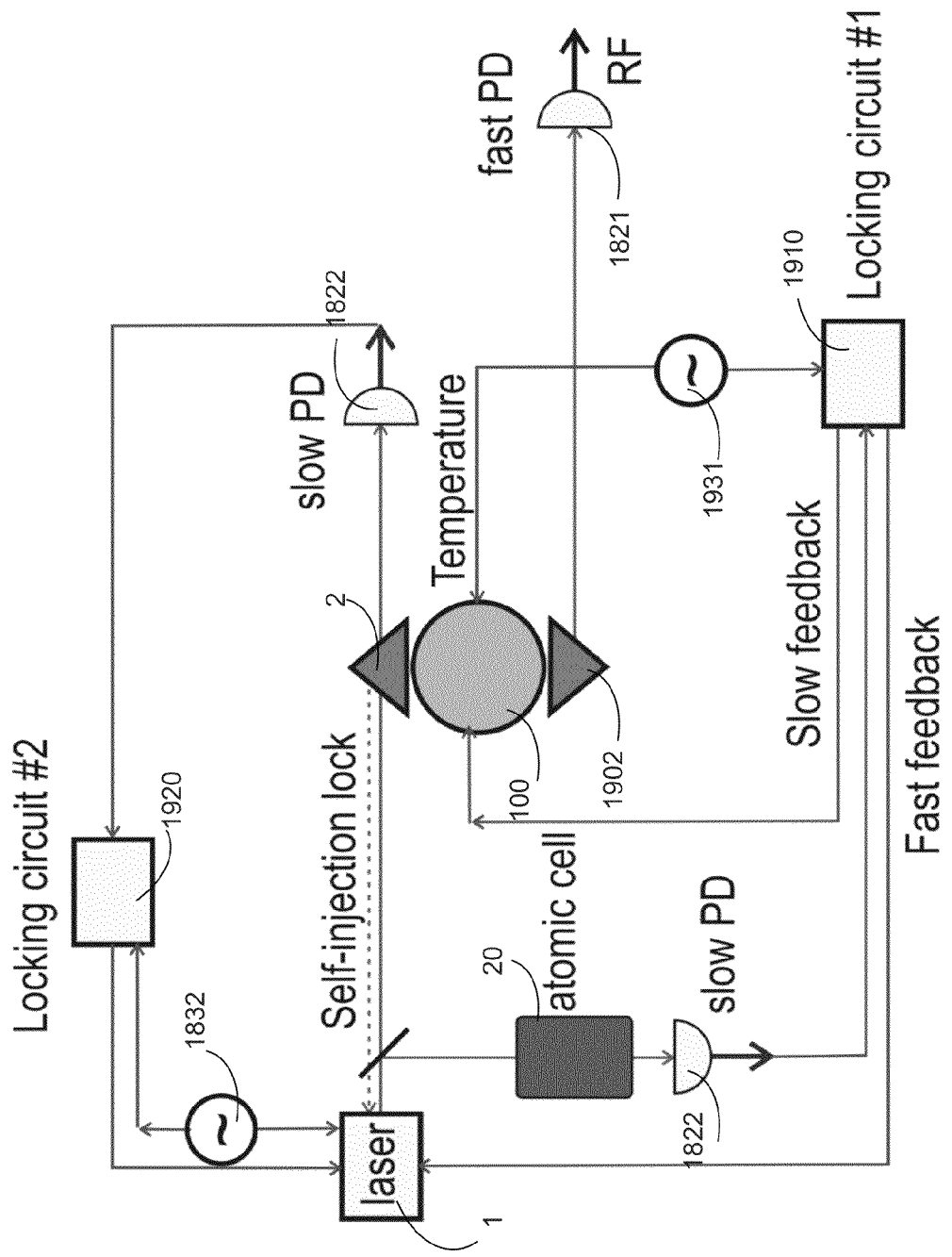

FIG. 20 shows another example based on the design in FIG. 19 where the laser 1 and the resonator 100 are directly locked to each other via fast injection locking. The locking circuit 1910 is provided to lock both the laser 1 and the resonator 100 to the atomic reference. The locking circuit 1920 is provided to lock the laser 1 to the resonator 100 and can be, e.g., a PDH locking circuit. The locked laser 1 can be implemented by, e.g., an external cavity semiconductor laser and can be tuned by tuning the frequency of the resonator 100. The laser/resonator combination is locked to an atomic transition (e.g. 87Rb D1 line). To perform the locking the frequency of the laser is modulated via temperature modulation of the WGM resonator and the error signal is fed back to correct the temperature of the resonator. Since changing the laser current also changes the temperature of the resonator, an additional (fast) lock loop is provided from the locking circuit 1910 to control the laser 1 in addition to the self injection locking.

In tests conducted on the device in FIG. 20, the atomic line had less than $10^6$ Hz/K thermal drift. The frequency of the laser locked to the resonator can be kept within 100 kHz from the atomic transition. The WGM frequency can drift with respect to the laser frequency by less than the full width at half maximum of the mode, which generally is on the order of 100 kHz. Thus, the thermal stabilization of the atomic cell 20 at a level about 100 mK can lead to absolute long term stabilization of the optical mode better than 100 kHz. When the FSR of the resonator 100 drifts not more than 2.5 Hz if $\omega 0/FSR = 4 \times 10^4$. Therefore, the expected short term stability of the oscillator as determined by its Allan deviation is on the order of $2.5 \times 10^{-10}$ (for 10 GHz FSR). The Allan deviation decreases as $\tau^{-1}$ for long enough observation times. Therefore, excellent long term stability can be expected of this device.

Figure 21:
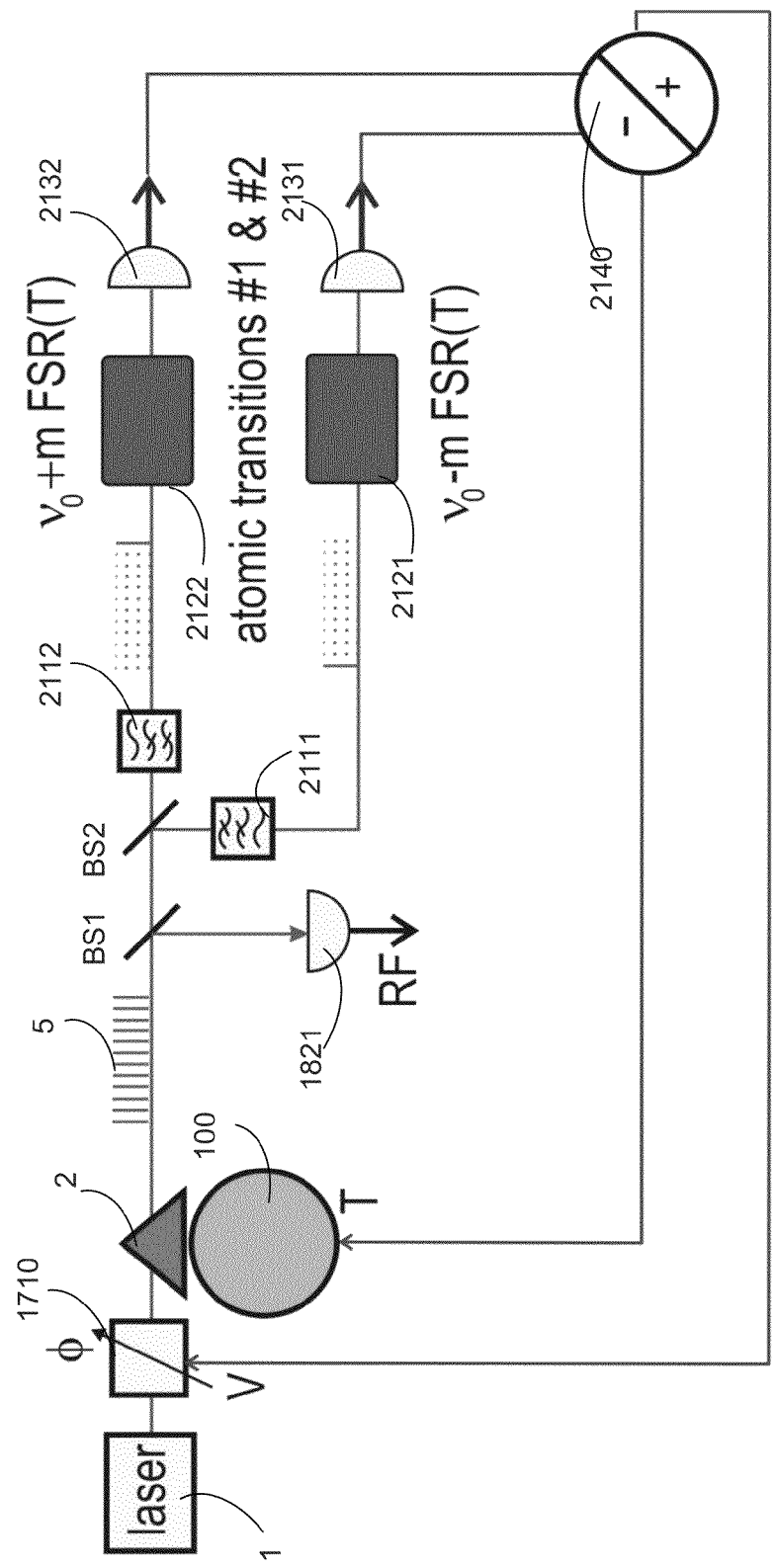

FIG. 21 shows an example of an optical comb generation device that uses two atomic cells to provide two atomic references for two separate locking points. The frequency stability of an optical comb may be characterized by two types of frequency parameters: a frequency of each spectral component in the optical comb and a frequency spacing or FSR between two adjacent spectral components in the optical comb. The prior examples use a single atomic reference as a single frequency locking reference point. The presence of two atomic cells 2121 and 2122 at different optical reference frequencies allows locking points to provide better locking stability.

In FIG. 21, the laser 1 and the resonator 100 can be locked to each other via injection locking or other locking methods. The optical comb optical output 5 from the resonator 100 is generated based on nonlinear optical wave mixing and parametric amplification inside the resonator 100. This optical comb 5 is split by a first beam splitter BS1 where a small portion of the beam is directed to a fast detector 1821 to produce the RF output. A second beam splitter BS2 receives the beam from the BS1 and splits the received beam into a first beam and a second beam. The first beam is directed through a first optional optical bandpass filter 2111 to produce a first filtered beam at a first optical frequency and the second beam is directed through a second optional optical bandpass filter 2112 to produce a second filtered beam at a second optical frequency different from the first optical frequency. This device locks two optical comb lines to two different atomic transitions of the two atomic cells 2121 and 2122, respectively. The optical comb 5 generated in the resonator 100 should have cover several optical lines of the atomic cells 2121 and 2122. The WGM resonator 100 is structured to have two modes having frequencies in the nearest vicinity of two atomic transitions. A first optical detector 2131 is used to receive the optical transmission of the first atomic cell 2121 which corresponds to a first error signal indicating a frequency error of the laser frequency or the resonator resonance relative to the first atomic transition of the first atomic cell 2121. A second optical detector 2132 is used to receive the optical transmission of the second atomic cell 2122 which corresponds to a second error signal indicating a frequency error of the laser frequency or the resonator resonance relative to the second atomic transition of the second atomic cell 2122. These two error signals are directed to a feedback control circuit 2140 that generates a first feedback signal to the phase adjustment device 1710 for producing the dither modulation and a second feedback signal to the resonator 100 for tuning the resonator 100 to reduce the frequency error.

The two atomic frequency references can be separated by a frequency difference much greater than the FSR of the nonlinear optical resonator 100 or/and the optical comb repetition frequency. The frequency locking at the two atomic frequency references in FIG. 21 via the two feedback loops to the phase adjustment device 1710 and the tunable WGM resonator 100 not only stabilizes the laser 1 or the resonator 100 but also locks the frequency comb repetition rate to the fraction of the frequency difference between the two atomic frequency references.

The above illustrated device examples can be implemented in planar architectures on semiconductor substrates such as silicon wafers. In some implementations, optical WGM resonators can be monolithically integrated on a substrate in various configurations, e.g., an optical WGM resonator may be integrated on a planar semiconductor structure. The optical WGM resonator may be optical disk or ring resonators integrated on a substrate on which other components of the device are also integrated, including the electronic circuit elements. This integration of the optical resonator and certain other components described in the above examples provides a compact opto-electronic chip that can be implemented in various applications.

While this document contains many specifics, these should not be construed as limitations on the scope of an invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately, or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

Only a few implementations are disclosed. Variations and enhancements of the described implementations and other implementations can be made based on what is described and illustrated in this document.

What is claimed is:

1. A device, comprising:
    an optical resonator formed of an optical material exhibiting optical nonlinearity and producing an optical frequency comb based on nonlinear wave mixing caused by the optical nonlinearity;
    a laser that is tunable and produces laser light that interacts with the optical material of the optical resonator based on the nonlinear wave mixing to produce the optical frequency comb;
    a laser locking mechanism that locks the laser to the optical resonator;
    an atomic reference device that includes atoms or molecules providing an atomic or molecular transition and is coupled to receive light coupled out of the optical resonator to produce output light carrying information of the atomic or molecular transition;
    a first optical detector that receives the output light from the atomic reference device to produce a first detector output;
    a feedback circuit that receives the first detector output and produces a feedback signal, the feedback circuit coupled to at least one of the laser or the optical resonator to apply the feedback signal to stabilize the at least one of the laser or the optical resonator; and
    a second optical detector that receives light coupled by an optical coupler out of the optical resonator to convert the optical frequency comb into a second detector signal which is stabilized in frequency relative to the atomic or molecular transition of the atomic reference device.

2. The device in claim 1, wherein:
    the optical resonator is an optical whispering gallery mode resonator.

3. The device in claim 1, wherein:
    the optical resonator is made of a nonlinear crystalline material.

4. The device as in claim 1, wherein the laser and the optical resonator are locked to each other via injection locking and the laser locking mechanism includes an optical coupler that couples the laser light into the optical resonator and couples light out of the optical resonator back to the laser to cause injection locking of the laser to the optical resonator.

5. The device as in claim 1, wherein the laser locking mechanism includes a locking circuit that locks the laser and the optical resonator to each other.

6. The device as in claim 5, wherein the locking circuit is a Pound-Drever-Hall (PDH) circuit.

7. The device as in claim 1, comprising:
    an optical Mach-Zehnder interferometer coupled between the atomic reference device and the optical resonator, the optical Mach-Zehnder interferometer coupled to receive the light coupled out of the optical resonator and direct the light coupled out of the optical resonator into the atomic reference device after processing the light as a first optical beam in resonance with a first atomic transition in the atomic reference device and a second optical beam in resonance with a second, different atomic transition in the atomic reference device, wherein the first and second atomic transitions are associated with the atomic or molecular transition of the atomic reference device.

8. The device as in claim 7, wherein the laser is modulated to produce laser light have a dither modulation in connection with the feedback signal for stabilizing the laser or the optical resonator.

9. The device as in claim 1, wherein the atomic reference device includes an atomic vapor cell.

10. The device as in claim 1, wherein the atomic reference device includes an atomic trap.

11. The device as in claim 1, wherein the atomic reference device includes an atomic beam.

12. A device, comprising:
    an optical resonator which exhibits optical nonlinearity and is configured to be a whispering gallery mode resonator supporting optical whispering gallery modes;
    a laser that is tunable and produces laser light;
    an optical coupler that couples the laser light into the optical resonator to cause generation of an optical comb signal of different frequencies based on nonlinear wave mixing in the optical resonator;
    an atomic reference device that includes atoms or molecules providing an atomic or molecular transition as a frequency reference; and
    a locking circuit that locks at least one of the optical resonator or the laser in frequency relative to the atomic or molecular transition of the atomic reference device to stabilize the optical comb of different frequencies.

13. The device as in claim 12, wherein the locking circuit directs light from the optical resonator back to the laser to cause injection locking of the laser relative to a mode of the optical resonator.

14. The device as in claim 13, wherein the locking circuit includes an optical coupler that couples light out of the optical resonator and directs the coupled light back to the laser.

15. The device as in claim 12, wherein the locking circuit includes a Pound-Drever-Hall (PDH) circuit.

16. A method for generating a radio frequency (RF) or microwave signal stabilized relative to an atomic frequency reference, comprising:

directing laser light into an optical resonator to produce confined laser light inside the optical resonator in at least two different optical resonator modes that are separated by a free spectral range (FSR) of the optical resonator or a harmonic of the FSR;

coupling the confined laser light inside the optical resonator out to as an optical resonator output having two optical spectral components corresponding to the at least two different optical resonator modes;

locking the optical resonator relative to an atomic frequency reference to stabilize the two optical spectral components corresponding to the at least two different optical resonator modes in the optical resonator output; and directing the optical resonator output into a photodetector to produce a detector signal at a frequency of a frequency difference between the two optical spectral components that is stabilized relative to the atomic frequency reference.

17. The method as in claim 16, comprising:
operating a first laser to produce a first part of the laser light at the a first laser carrier frequency corresponding to a first optical resonator mode of the optical resonator;
locking the first laser to the first optical resonator mode of the optical resonator;
operating a second, separate laser to produce a second part of the laser light at the a second laser carrier frequency corresponding to a second optical resonator mode of the optical resonator; and
locking the second laser to the second optical resonator mode of the optical resonator.

18. The method as in claim 17, comprising:
locking the first and second lasers relative to each other.

19. The method as in claim 16, comprising:
configuring the optical resonator as a nonlinear optical resonator to generate an optical frequency comb via nonlinear wave mixing inside the optical resonator, wherein the generated optical frequency comb includes the at least two different optical resonator modes.

20. The method as in claim 19, comprising:
directing light of the optical resonator output into the atomic frequency reference to generate an error signal; and
using the error signal to lock the optical resonator relative to the atomic frequency reference.

21. The method as in claim 20, comprising:
processing the light of the optical resonator output to generate a first beam at a first optical frequency in resonance with a first atomic transition in the atomic frequency reference and a second beam at a second, different optical frequency in resonance with a second atomic transition in the atomic frequency reference that shares a common excited state with the first atomic transition; and
using an electromagnetically induced transparency produced by the first and second atomic transitions to generate the error signal.

22. The method as in claim 16, comprising:
operating a laser to generate the laser light;
splitting a portion of the laser light, prior to directing the laser light into the optical resonator, to transmit through the atomic frequency reference to generate an error signal; and using the error signal to lock the optical resonator relative to the atomic frequency reference.

23. A method for generating and stabilizing an optical comb relative to an atomic frequency reference, comprising:
operating a laser to produce laser light;
directing the laser light into an optical resonator exhibiting optical nonlinearity and supporting optical whispering gallery modes with sufficient power to generate an optical comb signal of different frequencies based on nonlinear wave mixing in the optical resonator;
locking the laser and the optical resonator relative to each other; and
locking the laser or the optical resonator relative to an atomic frequency reference to stabilize the optical comb of different frequencies.

24. The method as in claim 23, comprising:
locking the laser and the optical resonator relative to each other via injection locking based on an optical feedback from the optical resonator to the laser.

25. The method as in claim 23, comprising:
locking the laser and the optical resonator relative to each other via a Pound-Drever-Hall (PDH) circuit.

26. The method as in claim 23, comprising:
locking the laser or the optical resonator relative to an atomic frequency reference based on an electromagnetically induced transparency in an atomic or molecular vapor.

27. The method as in claim 23, comprising:
providing a second atomic frequency reference different from the atomic frequency reference; and
locking the laser or the optical resonator relative to both the atomic frequency reference and the second atomic frequency reference.

28. A device, comprising:
an optical resonator formed of a crystalline material exhibits optical nonlinearities and configured to be a whispering gallery mode resonator supporting optical whispering gallery modes;
a laser that is tunable and produces laser light;
an optical coupler that couples the laser light into the optical resonator which produces an optical comb of different frequencies based on optical nonlinearities of the crystalline material and couples light inside the optical resonator out of the optical resonator back to the laser to cause injection locking of the laser to the optical resonator;
an atomic reference device that includes atoms or molecules providing a atomic or molecular transition and is coupled to receive light coupled out of the optical resonator to produce output light carrying information of the a atomic or molecular transition;
a first optical detector that receives the output light from the atomic reference device to produce a first detector output;
a feedback circuit that receives the first detector output and produces a feedback signal, the feedback circuit coupled to at least one of the laser or the optical resonator to apply the feedback signal to stabilize the at least one of the laser or the optical resonator; and
a second optical detector that receives light coupled by the optical coupler out of the optical resonator to convert the optical comb of different frequencies into a second detector signal which is stabilized in frequency relative to the atomic or molecular transition of the atomic reference device.

* * * * *